US012062664B2

(12) United States Patent
Lee et al.

(10) Patent No.: US 12,062,664 B2
(45) Date of Patent: Aug. 13, 2024

(54) DISPLAY PANEL INCLUDING SHIELD LAYER

(71) Applicant: SAMSUNG DISPLAY CO., LTD., Yongin-si (KR)

(72) Inventors: Soyoung Lee, Yongin-si (KR); Jieun Lee, Yongin-si (KR); Minhee Choi, Yongin-si (KR); Sungho Kim, Yongin-si (KR); Jongryuk Park, Yongin-si (KR); Seokje Seong, Yongin-si (KR); Seungwoo Sung, Yongin-si (KR); Ilgoo Youn, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 341 days.

(21) Appl. No.: 17/398,236

(22) Filed: Aug. 10, 2021

(65) Prior Publication Data
US 2022/0181354 A1    Jun. 9, 2022

(30) Foreign Application Priority Data
Dec. 9, 2020   (KR) .................. 10-2020-0171704

(51) Int. Cl.
*H01L 27/12*   (2006.01)
*G09G 3/3258*  (2016.01)
(Continued)

(52) U.S. Cl.
CPC ......... *H01L 27/124* (2013.01); *G09G 3/3258* (2013.01); *H01L 23/552* (2013.01);
(Continued)

(58) Field of Classification Search
CPC ............ H01L 27/124; H01L 27/1225; H01L 27/1251; H10K 59/126; H10K 59/8792; H10K 59/131
See application file for complete search history.

(56) References Cited

U.S. PATENT DOCUMENTS 8,183,755 B2   5/2012 Bang et al.
9,934,723 B2   4/2018 Lee et al.
(Continued)

FOREIGN PATENT DOCUMENTS

KR        101015885 B1   2/2011
KR      1020160002337 A  1/2016
(Continued)

*Primary Examiner* — Paisley L Wilson
(74) *Attorney, Agent, or Firm* — CANTOR COLBURN LLP

(57) ABSTRACT

A display panel includes a first thin-film transistor ("TFT") arranged in a display area of a substrate and including a first semiconductor layer including a silicon semiconductor, a second TFT connected to the first TFT and including a second semiconductor layer including an oxide semiconductor, a voltage line connected to the first TFT, and a shield layer arranged between the substrate and the first semiconductor layer, and including a pattern and a connection line, the pattern overlapping the first semiconductor layer, the connection line extending from the pattern, and a voltage that is a same as a voltage applied to the voltage line being applied to the shield layer.

7 Claims, 24 Drawing Sheets

(51) Int. Cl.

| | | |
|---|---|---|
| *H01L 23/552* | (2006.01) | |
| *H10K 59/121* | (2023.01) | |
| *H10K 59/126* | (2023.01) | |
| *H10K 59/131* | (2023.01) | |
| *G09G 3/3233* | (2016.01) | |
| *G09G 3/3266* | (2016.01) | |
| *H10K 59/80* | (2023.01) | |

(52) U.S. Cl.
CPC ...... *H01L 27/1218* (2013.01); *H01L 27/1225* (2013.01); *H01L 27/1251* (2013.01); *H10K 59/1213* (2023.02); *H10K 59/126* (2023.02); *H10K 59/131* (2023.02); *G09G 3/3233* (2013.01); *G09G 3/3266* (2013.01); *G09G 2300/0819* (2013.01); *G09G 2320/0257* (2013.01); *G09G 2330/021* (2013.01); *H10K 59/8792* (2023.02)

(56) References Cited

U.S. PATENT DOCUMENTS

| | | | |
|---|---|---|---|
| 9,997,586 B2 | 6/2018 | Kim | |
| 10,381,425 B2 | 8/2019 | Kang et al. | |
| 2015/0187959 A1* | 7/2015 | Yoon | H01L 27/1225 |
| | | | 257/43 |
| 2015/0379923 A1* | 12/2015 | Lee | H10K 59/1315 |
| | | | 345/82 |

FOREIGN PATENT DOCUMENTS

| | | |
|---|---|---|
| KR | 1020170050369 A | 5/2017 |
| KR | 1020180065731 A | 6/2018 |
| KR | 1020200000856 A | 1/2020 |

\* cited by examiner

DISPLAY PANEL INCLUDING SHIELD LAYER

This application claims priority to Korean Patent Application No. 10-2020-0171704, filed on Dec. 9, 2020, and all the benefits accruing therefrom under 35 U.S.C. § 119, the content of which in its entirety is herein incorporated by reference.

BACKGROUND

1. Field

One or more embodiments relate to a display panel and a display apparatus including the same, and more particularly, to a display apparatus driven with a silicon-based thin-film transistor ("TFT") and an oxide-based TFT.

2. Description of the Related Art

Recently, usage of display apparatuses is diversified. In addition, as display apparatuses have become thinner and lighter, a range of their usage is being gradually extended.

As display apparatuses are variously utilized, there may be various ways in designing a shape of the display apparatuses. In addition, various functions that are combined or associated with display apparatuses are increased.

SUMMARY

One or more embodiments include a display apparatus with reduced power consumption and improved display quality. However, such a technical problem is an example, and the invention is not limited thereto.

Additional features will be set forth in part in the description which follows and, in part, will be apparent from the description, or may be learned by practice of the presented embodiments of the invention.

In an embodiment of the invention, a display panel includes a substrate including a display area and a peripheral area surrounding the display area, a first thin-film transistor ("TFT") arranged in the display area of the substrate and including a first semiconductor layer and a first gate electrode, the first semiconductor layer including a silicon semiconductor, and the first gate electrode overlapping the first semiconductor layer, a second TFT connected to the first TFT and including a second semiconductor layer and a second gate electrode, the second semiconductor layer including an oxide semiconductor, and the second gate electrode overlapping the second semiconductor layer, a voltage line connected to the first TFT, and a shield layer arranged between the substrate and the first semiconductor layer, and including a pattern and a connection line, the pattern overlapping the first semiconductor layer, the connection line extending from the pattern in a column direction, and a voltage that is a same as a voltage applied to the voltage line being applied to the shield layer.

In an embodiment, the second TFT may be connected between the first semiconductor layer and the first gate electrode of the first TFT.

In an embodiment, the shield layer may include a metal material.

In an embodiment, the display panel may further include a first inorganic layer between the substrate and the shield layer, and a second inorganic layer between the shield layer and the first semiconductor layer.

In an embodiment, the substrate may include an organic layer.

In an embodiment, the display panel may further include an electrode layer overlapping the first gate electrode and connected to the voltage line.

In an embodiment, the display panel may further include a voltage supply line arranged in the peripheral area and connected to the shield layer.

In an embodiment of the invention, a display panel includes a substrate including a display area and a peripheral area surrounding the display area, a first TFT arranged in the display area of the substrate and including a first semiconductor layer and a first gate electrode, the first semiconductor layer including a silicon semiconductor, and the first gate electrode overlapping the first semiconductor layer, a second TFT connected to the first TFT and including a second semiconductor layer and a second gate electrode, the second semiconductor layer including an oxide semiconductor, and the second gate electrode overlapping the second semiconductor layer, a voltage line connected to the first TFT, and a shield layer arranged between the substrate and the first semiconductor layer, and including a pattern and a connection line, the pattern overlapping the first semiconductor layer, the connection line extending from the pattern in a row direction, and a voltage that is a same as a voltage applied to the voltage line being applied to the shield layer.

In an embodiment, the second TFT may be connected between the first semiconductor layer and the first gate electrode of the first TFT.

In an embodiment, the shield layer may include a metal material.

In an embodiment, the display panel may further include a first inorganic layer between the substrate and the shield layer, and a second inorganic layer between the shield layer and the first semiconductor layer.

In an embodiment, the substrate may include an organic layer.

In an embodiment, the display panel may further include an electrode layer overlapping the first gate electrode and connected to the voltage line.

In an embodiment, the display panel may further include a voltage supply line arranged in the peripheral area and connected to the shield layer.

In an embodiment of the invention, a display panel includes a substrate including a display area and a peripheral area surrounding the display area, a plurality of pixel circuits each arranged in an area where a row intersects a column in the display area of the substrate, and including a silicon-based TFT and an oxide-based TFT, a plurality of voltage lines connected to the silicon-based TFT of each of the plurality of pixel circuits, and a shield layer arranged between the substrate and the silicon-based TFTs of the plurality of pixel circuits, and a voltage that is a same as a voltage applied to the plurality of voltage lines being applied to the shield layer, where the shield layer includes a plurality of patterns overlapping the silicon-based TFT of each of the plurality of pixel circuits, first connection lines connecting the plurality of patterns arranged in a column direction, extending in the column direction, and arranged on a two-column basis, and second connection lines connecting the plurality of patterns arranged in a row direction, extending in the row direction, and arranged on a row basis.

In an embodiment, the shield layer may include a metal material.

In an embodiment, the display panel may further include a first inorganic layer between the substrate and the shield layer, and a second inorganic layer between the shield layer and the first semiconductor layer.

In an embodiment, the substrate may include an organic layer.

In an embodiment, the silicon-based TFT of each of the plurality of pixel circuits may include a semiconductor layer and a gate electrode overlapping a portion of the semiconductor layer, and the display panel may further include a first signal line and a second signal line each, in a plan view, adjacent to the semiconductor layer with the semiconductor layer therebetween, extending in the row direction, and including a portion overlapping the first connection line, and a third signal line adjacent to the semiconductor layer, extending in the column direction, and including a portion overlapping the second connection line.

In an embodiment, the display panel may further include a voltage supply line arranged in the peripheral area and connected to the shield layer.

BRIEF DESCRIPTION OF THE DRAWINGS

The above and other features and advantages of certain embodiments of the invention will be more apparent from the following description taken in conjunction with the accompanying drawings, in which.

DETAILED DESCRIPTION

Figure 1:
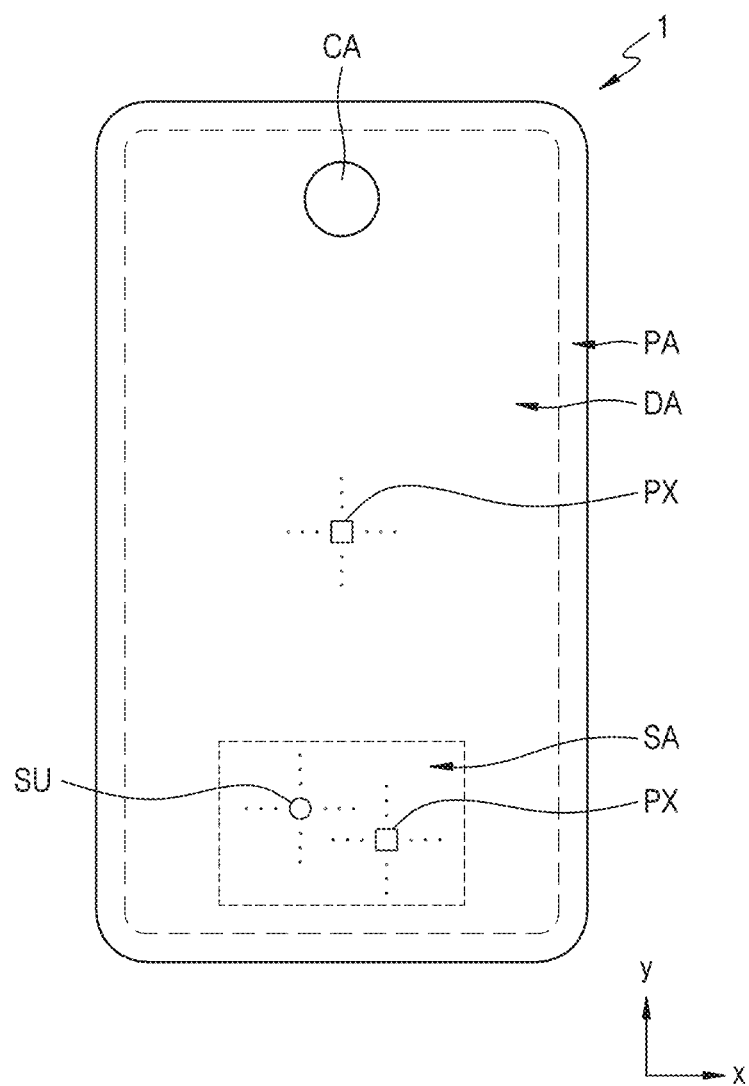
FIG. 1 is a view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. Since sizes and thicknesses of elements in the drawings are arbitrarily illustrated for convenience of explanation, for example, the disclosure is not limited thereto.

In the specification, "A and/or B" means A or B, or A and B. In the specification, "at least one of A and B" means A or B, or A and B.

As used herein, when a wiring is referred to as "extending in a first direction or a second direction", it means that the wiring not only extends in a straight line shape but also extends in a zigzag or in a curve in the first direction or the second direction.

As used herein, "in a plan view" means that an objective portion is viewed from above, and "in a cross-sectional view" means that a cross-section of an objective portion taken vertically is viewed from a lateral side. As used herein, when it is referred that a first element "overlaps" a second element, the first element is arranged above or below the second element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a view of an embodiment of a display apparatus.

A display apparatus in an embodiment may be implemented as an electronic apparatus such as smartphones, mobile phones, navigation apparatuses, game consoles, televisions, head units for automobiles, notebook computers, lap-top computers, tablet computers, personal multimedia players ("PMPs"), and personal digital assistants ("PDAs"). In addition, an electronic apparatus may be a flexible apparatus.

Referring to FIG. 1, a display apparatus in an embodiment includes a display area DA and a peripheral area PA. An image is displayed on the display area DA, and the peripheral area PA is a non-display area around the display area DA.

In a plan view, the display area DA may have a quadrangular (e.g., rectangular) shape as shown in FIG. 1. In another embodiment, the display area DA may have a polygonal shape such as triangles, pentagons, and hexagons, a circular shape, an elliptical shape, or an irregular shape. The display area DA may include a round cornered edge.

Pixels PX may be arranged in the display area DA, and may include various display elements such as an organic light-emitting diode OLED. A pixel PX may be provided in plural and arranged in various shapes such as a stripe arrangement, a pentile arrangement, and a mosaic arrangement in an x-direction and a y-direction to display an image.

The display area DA may include a sensing area SA. The display area DA may overlap the sensing area SA. At least a portion of the display area DA may be set to the sensing area SA. As shown in FIG. 1, only a portion of the display area DA may be set to the sensing area SA. In another embodiment, the display area DA may be entirely set to the sensing area SA. In another embodiment, the display area DA may be adjacent to the sensing area SA such that only a portion of the display area DA overlaps a portion of the sensing area SA. A plurality of pixels PX and a plurality of sensors SU may be arranged in the sensing area SA. The sensor SU may be a sensor which senses biometric information of human body related to at least one of a user's heartbeat, stress, fingerprint, oxygen saturation, blood pressure, blood sugar, and skin color.

The sensors SU may be arranged on a surface (e.g., a bottom surface) facing a surface (e.g., a front surface) on which an image is displayed, from among two opposite surfaces of the display panel. The sensors SU may use, as a light source, a display element of at least one pixel PX arranged therearound. For this purpose, the sensors SU may overlap at least some of the pixels PX arranged in the sensing area SA or be arranged around the pixels PX arranged in the sensing area SA. In an embodiment, at least some of the sensors SU may overlap a non-emission area between neighboring pixels PX arranged in the sensing area SA. The pixel PX and the sensor SU may be arranged at a preset ratio according to a sensing resolution. In an embodiment, the resolution of the sensor SU may be less than the resolution of the pixel PX.

A display apparatus 1 may include a component area CA. The component area CA may be at least partially surrounded by the display area DA. In an embodiment, as shown in FIG. 1, the component area CA may be entirely surrounded by the display area DA. The component area CA may be a position in which a component is arranged. The component area CA may include transmissive area through which light and/or sound output from the component to the outside, or progressing toward the component from the outside may be transmitted. In an embodiment, in the case where light passes through the component area CA, a light transmittance may be about 50 percent (%) or more, more preferably, about 70% or more, about 75% or more, about 80% or more, about 85% or more, or about 90% or more. The component may be an electronic element that uses light or sound. In an embodiment, the electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound. The electronic element that uses light may use light in various wavelength bands such as visible light, infrared light, or ultraviolet light. In the case where a through hole corresponding to the component area CA is defined in a display panel 10 (refer to FIG. 3), light or sound output from or received by the electronic element may be more effectively utilized.

Though it is shown in FIG. 1 that the component area CA is arranged on one side (the top central portion) of the display area DA, which has a quadrangular shape, the invention is not limited thereto. In an embodiment, the display area DA may have a circular shape, an elliptical shape, or a polygonal shape such as triangles or pentagons. The position of the component CA may be variously changed. In an embodiment, the component CA may be arranged on the top right side of the display area DA in a plan view (e.g. an x-y plane).

The peripheral area PA is arranged around the display area DA and may be an area in which an image is not displayed. The peripheral area PA may surround the display area DA.

For convenience of description, though an organic light-emitting display apparatus including an organic light-emitting diode as a display element is described as an example, the invention is not limited thereto. In another embodiment, various types of display apparatuses such as inorganic light-emitting display apparatus, nano light-emitting display apparatus, and quantum-dot light emitting display apparatus may be used.

Figure 2:
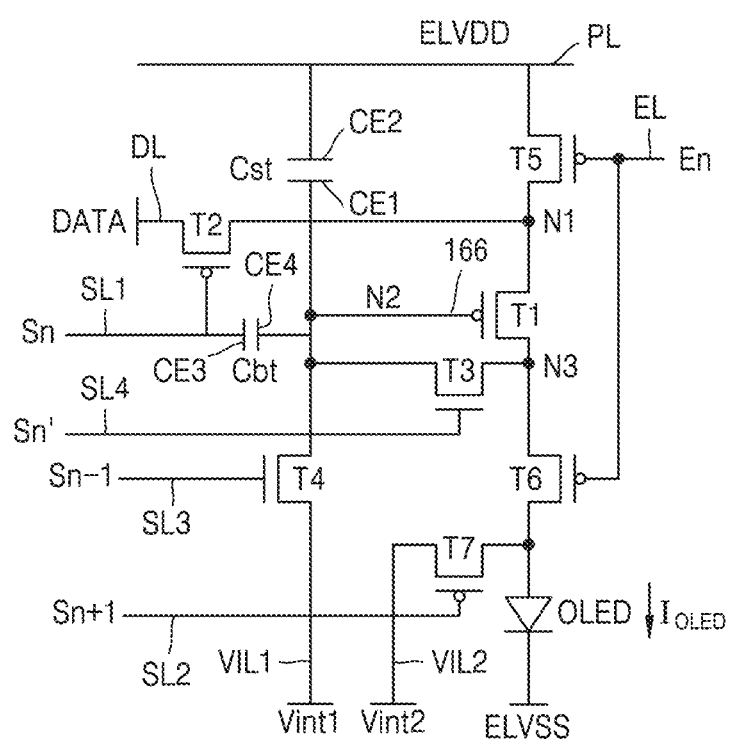
FIG. 2 is an equivalent circuit diagram of an embodiment of a pixel.

FIG. 2 is an equivalent circuit diagram of an embodiment of a pixel.

Referring to FIG. 2, a pixel PX includes a plurality of first to seventh transistors T1, T2, T3, T4, T5, T6, and T7, a first capacitor Cst, a second capacitor Cbt, an organic light-emitting diode OLED as a display element, signal lines connected thereto, first and second initialization voltage lines VIL1 and VIL2, and a driving voltage line PL. The signal lines may include a data line DL, a first scan line SL1, a second scan line SL2, a third scan line SL3, a fourth scan line SL4, and an emission control line EL. In another embodiment, at least one of the signal lines, the first and second initialization voltage lines VIL1 and VIL2, and/or the driving voltage line PL may be shared by neighboring pixels.

The driving voltage line PL may transfer a driving voltage ELVDD to the first transistor T1. The first initialization voltage line VIL1 may transfer a first initialization voltage Vint1 to a pixel PX, the first initialization voltage Vint1 initializing the first transistor T1. The second initialization voltage line VIL2 may transfer a second initialization voltage Vint2 to a pixel PX, the second initialization voltage Vint2 initializing an organic light-emitting diode OLED.

It is shown in FIG. 2 that the third transistor T3 and the fourth transistor T4 from among the first to seventh transistors T1, T2, T3, T4, T5, T6, and T7 may be implemented as n-channel semiconductor metal oxide field-effect-transistor ("NMOSFET"), and the rest may be implemented as p-channel metal oxide semiconductor field-effect-transistor ("PMOSFET").

The first transistor T1 may be connected between the driving voltage line PL and the organic light-emitting diode OLED. The first transistor T1 may be connected to the driving voltage line (also referred to as a power voltage line) PL through the fifth transistor T5 and electrically connected to the organic light-emitting diode OLED through the sixth transistor T6. The first transistor T1 may serve as a driving transistor and receive a data signal DATA and supply a driving current $I_{OLED}$ to the organic light-emitting diode OLED according to a switching operation of the second transistor T2.

The second transistor T2 (a switching transistor) may be connected to the data line DL and a first node N1 and connected to the driving voltage line PL through the fifth transistor T5. The first node N1 may be a node to which the first transistor T1 and the fifth transistor T5 are connected. The second transistor T2 may be turned on according to a first scan signal Sn transferred through a first scan line SL1 to perform a switching operation of transferring a data signal DATA, which is transferred to the data line DL, to the first node N1.

The third transistor T3 (a compensation transistor) may be connected between a second node N2 and a third node N3. The third transistor T3 may be connected to the organic light-emitting diode OLED through the sixth transistor T6. The second node N2 may be a node to which a gate electrode of the first transistor T1 is connected. The third node N3 may be a node at which the first transistor T1 is connected to the sixth transistor T6. The third transistor T3 may be turned on according to a fourth scan signal Sn' transferred through the fourth scan line SL4 to diode-connect the first transistor T1, thereby compensating for a threshold voltage of the first transistor T1.

The fourth transistor T4 (a first initialization transistor) may be connected between the second node N2 and the first initialization voltage line VIL1. The fourth transistor T4 may be turned on according to a third scan signal Sn−1, which is a previous scan signal transferred through the third scan line SL3, which is a previous scan line, to transfer the first initialization voltage Vint1 from the first initialization voltage line VIL1 to the gate electrode of the first transistor T1, thereby initializing the voltage of the gate electrode of the first transistor T1.

The fifth transistor T5 (a first emission control transistor) may be connected between the driving voltage line PL and the first node N1. The sixth transistor T6 (a second emission control transistor) may be connected to the third node N3 and the organic light-emitting diode OLED. The fifth transistor T5 and the sixth transistor T6 may be simultaneously turned on according to an emission control signal En transferred through the emission control line EL to form a current path such that the driving current $I_{OLED}$ flows in a direction from the driving voltage line PL to the organic light-emitting diode OLED.

The seventh transistor T7 (a second initialization transistor) may be arranged between the organic light-emitting diode OLED and the second initialization voltage line VIL2. The seventh transistor T7 may be turned on according to a fourth scan signal Sn+1, which is a next scan signal transferred through the second scan line SL2, which is a next scan line, to transfer the second initialization voltage Vint2 from the second initialization voltage line VIL2 to the organic light-emitting diode OLED, thereby initializing the organic light-emitting diode OLED. However, the invention is not limited thereto, and in another embodiment, the seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the driving voltage line PL. The first capacitor Cst may maintain a voltage applied to the gate electrode of the first transistor T1 by storing and maintaining a voltage corresponding to a difference between the driving voltage line PL and the gate electrode of the first transistor T1.

The second capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first capacitor Cst. The second capacitor Cbt is a boosting capacitor. When a first scan signal Sn of the first scan line SL1 is a voltage that turns off the second transistor T2, the second capacitor Cbt may raise the voltage of the second node N2 to reduce a voltage (a black voltage) displaying black.

The organic light-emitting diode OLED may include a pixel electrode and an opposite electrode. The opposite electrode may receive a second power voltage ELVSS. In an embodiment, a voltage level of the second power voltage ELVSS may be lower than a voltage level of the driving voltage ELVDD. In an embodiment, the opposite electrode may be connected to a ground and receive 0 volt (V). The organic light-emitting diode OLED may display an image by receiving the driving current $I_{OLED}$ from the first transistor T1 and emitting light.

In an embodiment, at least one of the plurality of transistors T1, T2, T3, T4, T5, T6, and T7 includes a semiconductor layer including an oxide. The rest of the transistors includes a semiconductor layer including silicon. In detail, the first transistor directly influencing the brightness of the display apparatus may include polycrystalline silicon having high reliability. Through this configuration, the display apparatus of high resolution may be implemented.

Because an oxide semiconductor has high carrier mobility and low leakage current, a voltage drop is not large even when a driving time is long. That is, because a color change of an image depending on a voltage drop is not large even while the display apparatus is driven at low frequencies, the display apparatus may be driven at low frequencies. Because an oxide semiconductor has an advantage of a small leakage current, an oxide semiconductor is employed for at least one of the third transistor T3 and the fourth transistor T4 connected to the gate electrode of the first transistor T1, and thus, a leakage current that may flow to the gate electrode of the first transistor T1 may be prevented, and simultaneously, power consumption may be reduced.

Figure 3:
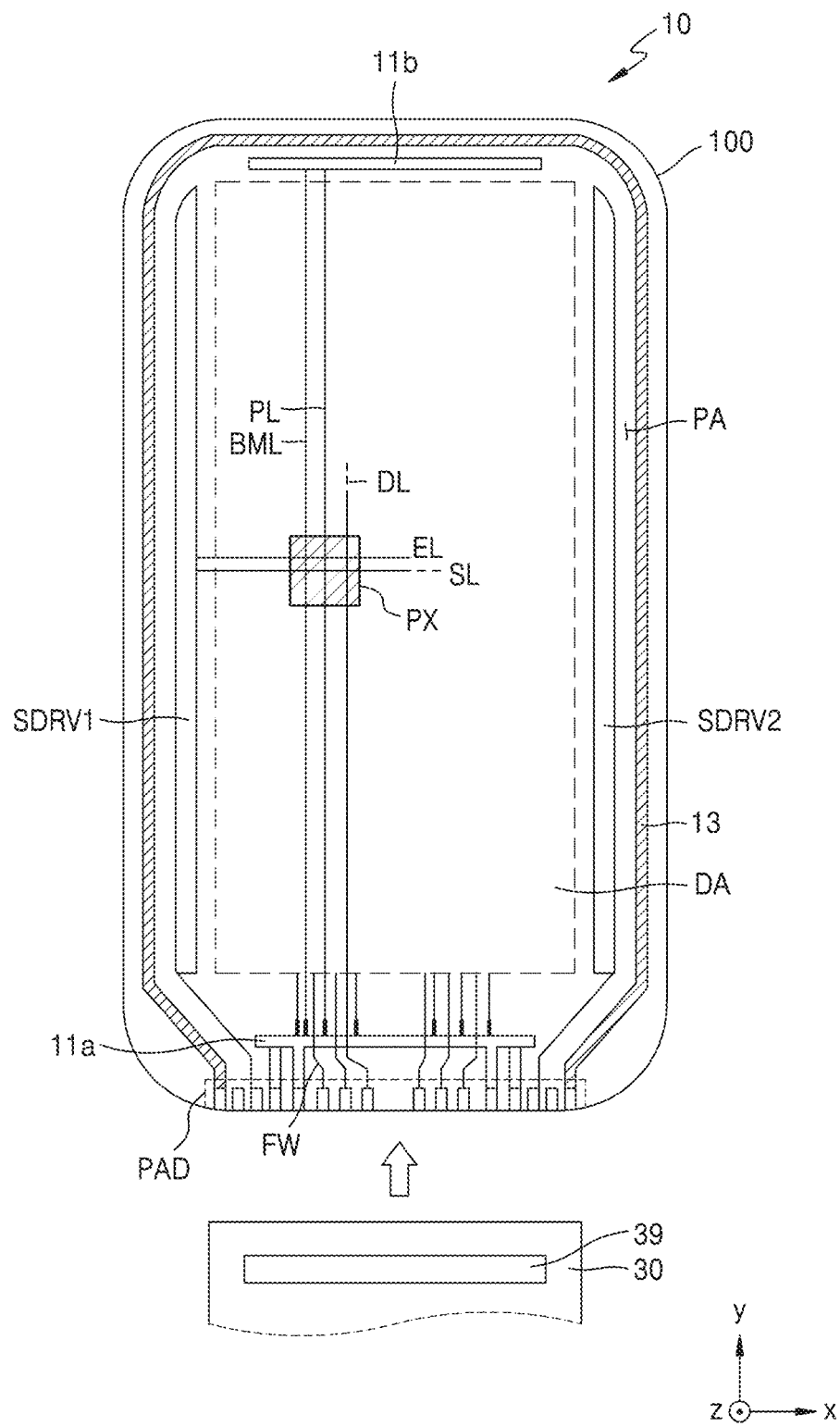
FIG. 3 is a plan view of an embodiment of a display panel.
Figure 4:
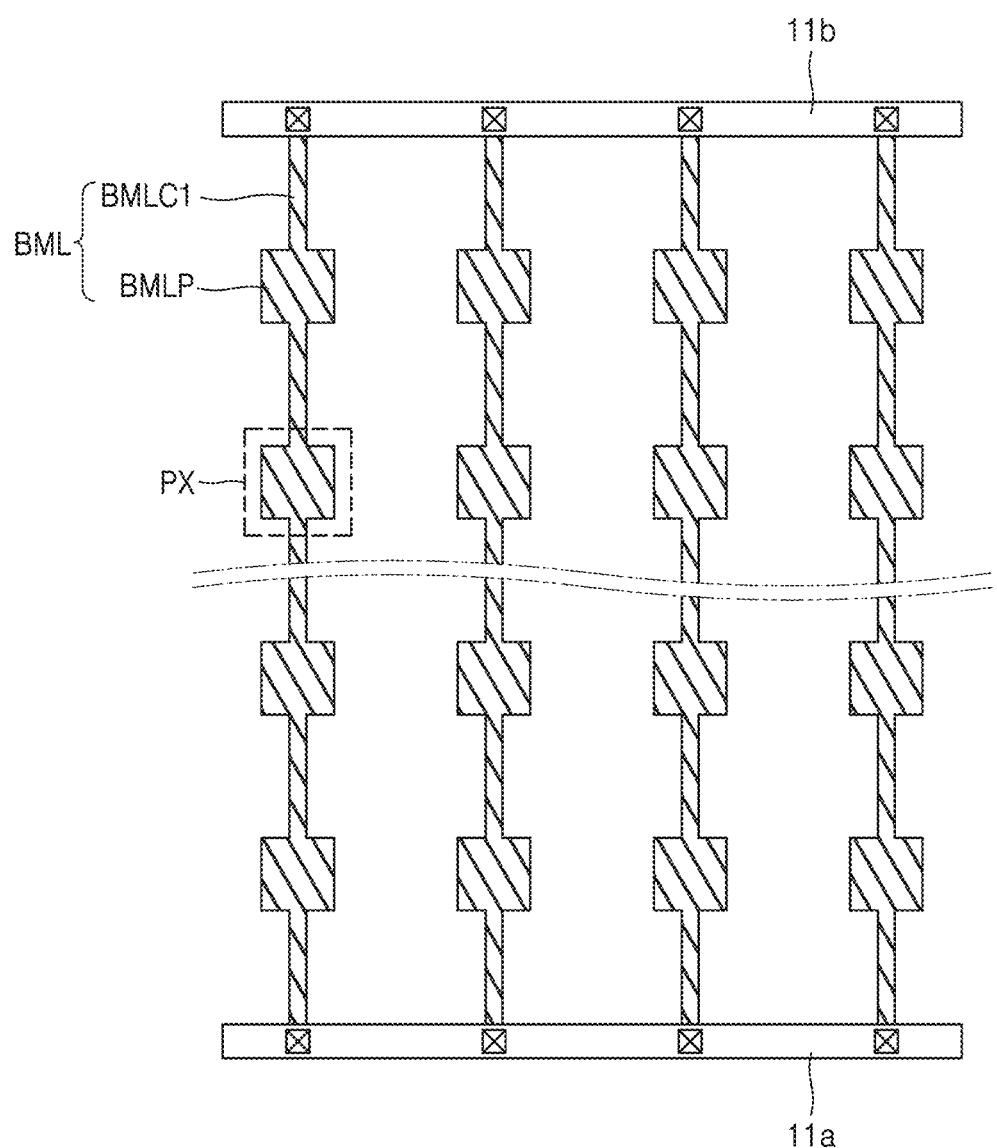
FIG. 4 is a view of an embodiment of a portion of FIG. 3.

FIG. 3 is a plan view of an embodiment of the display panel 10. FIG. 4 is a view of an embodiment of a portion of FIG. 3.

Referring to FIG. 3, the display apparatus may include the display panel 10. Various kinds of elements constituting the display panel 10 may be arranged on the substrate 100. That is, the substrate 100 of the display panel 10 may include the display area DA of the display apparatus and the peripheral area PA outside the display area DA.

The substrate 100 may include various materials such as glass, metal, or plastic. In an embodiment, the substrate 100 may include a flexible material. Here, the flexible material denotes a substrate that is easily warped, bended, foldable or rollable. In an embodiment, the substrate 100 including the flexible material may include ultra-thin glass, metal, or plastic, for example.

A plurality of pixels PX may be arranged in the display area DA. Each of the plurality of pixels PX may include a display element and a pixel circuit which drives the display element. In an embodiment, the display element may include an organic light-emitting diode OLED, an inorganic light-emitting diode ("LED"), a mini-LED, a nano light-emitting diode ("NED"), or quantum-dot light-emitting diode ("QD-LED"), for example. The display element may emit, for example, red, green, blue, or white light, for example. However, the display element may emit various other color light. The pixel circuit may include a plurality of transistors and a capacitor.

Wirings (Lines) may be arranged in the display area DA, and the wirings may apply an electric signal to the plurality of pixels PX. The signal lines that may apply an electric signal to the plurality of pixels PX may include a plurality of scan lines and a plurality of data lines. Each of the plurality of scan lines may extend in the x-direction, and each of the plurality of data lines may extend in the y-direction. The plurality of scan lines may be arranged, for example, in a plurality of rows to transfer a scan signal to the pixels PX. The plurality of data lines may be arranged, for example, in a plurality of columns to transfer a data signal to the pixels PX. Each of the plurality of pixels PX may be connected to at least one corresponding scan line of the plurality of scan lines, and at least one corresponding data line of the plurality of data lines.

Pads may be arranged in the peripheral area PA. Various wirings, a printed circuit board, or a driver integrated circuit ("IC") chip that transfer an electric signal to be applied to the display area DA is attached to the pads. Each of pixel circuits that drive the pixels PX may be electrically connected to outer circuits arranged in the peripheral area PA. A first scan driving circuit SDRV1, a second scan driving circuit SDRV2, a terminal portion PAD, first and second driving voltage supply lines 11a and 11b, and a common voltage supply line 13 may be arranged in the peripheral area PA.

The first scan driving circuit SDRV1 may apply a scan signal Sn to each of the pixel circuits that drive the pixels PX through the scan line SL. The first scan driving circuit SDRV1 may apply an emission control signal En to each pixel circuit through the emission control line EL. The second scan driving circuit SDRV2 may be arranged on the opposite side of the first scan driving circuit SDRV1 with the display area DA therebetween and be parallel to the first scan driving circuit SDRV1. Some of the pixel circuits of the pixels PX in the display area DA may be electrically connected to the first scan driving circuit SDRV1, and the rest of the pixel circuits may be electrically connected to the second scan driving circuit SDRV2.

The terminal portion PAD may be arranged on one side of the substrate 100. The terminal portion PAD is exposed by not being covered by an insulating layer and is connected to a display circuit board 30. A display driver 39 may be arranged on the display circuit board 30.

The display driver 39 may generate a control signal transferred to the first scan driving circuit SDRV1 and the second scan driving circuit SDRV2. The display driver 39 generates a data signal. The generated data signal may be transferred to pixel circuits of the pixels PX through a fan-out line FW and the data line DL connected to the fan-out line FW.

The display driver 39 may supply the driving voltage ELVDD to the first driving voltage supply line 11a and supply the common voltage ELVSS (refer to FIG. 2) to the common voltage supply line 13. The driving voltage ELVDD may be applied to the pixel circuits of the pixels PX through the driving voltage line PL connected to the first driving voltage supply line 11a, and the common voltage ELVSS may be applied to a common electrode of display elements through the common voltage supply line 13.

The first driving voltage supply line 11a may be connected to the terminal portion PAD and may extend in the x-direction on the bottom side of the display area DA. The second driving voltage supply line 11b may be further arranged on the top side of the display area DA, the second driving voltage supply line 11b extending in the x-direction. The first driving voltage supply line 11a and the second driving voltage supply line 11b may each be connected to the driving voltage line PL. The common voltage supply line 13 may be connected to the terminal portion PAD and may have a loop shape in which one side thereof is open to partially surround the display area DA.

A shield layer BML may be arranged in the display area DA, the shield layer BML blocking external light applied to the pixel circuits of the plurality of pixels PX. Referring to FIG. 4, the shield layer BML may include first connection lines BMLC1 extending in the y-direction and shield patterns BMLP. The first connection line BMLC1 may connect the shield patterns BMLP of the pixel circuits on the same column. The shield pattern BMLP may correspond to a portion of each pixel circuit and be arranged below the pixel circuit. The shield pattern BMLP and the first connection line BMLC1 may be a unitary single body. One end of the shield layer BML, that is, an end of one side of the first connection line BMLC1 may be connected to the first driving voltage supply line 11a, and another end, that is, an end of another side of the first connection line BMLC1 may be connected to the second driving voltage supply line 11b. Because the shield layer BML is connected to the first driving voltage supply line 11a, the shield layer BML, may receive the driving voltage ELVDD through the first driving voltage supply line 11a.

The shield layer BML may be arranged in a layer different from the first driving voltage supply line 11a and the second driving voltage supply line 11b and connected to the first driving voltage supply line 11a and the second driving voltage supply line 11b through contact holes. One or more insulating layers may be arranged between the shield layer BML and the first driving voltage supply line 11a and/or between the shield layer BML and the second driving voltage supply line 11b. A connection electrode may be arranged between the one or more insulating layers. The connection electrode may connect the shield layer BML to the first driving voltage supply line 11a and/or connect the shield layer BML to the second driving voltage supply line 11b through the contact hole of the insulating layer.

Figure 5:
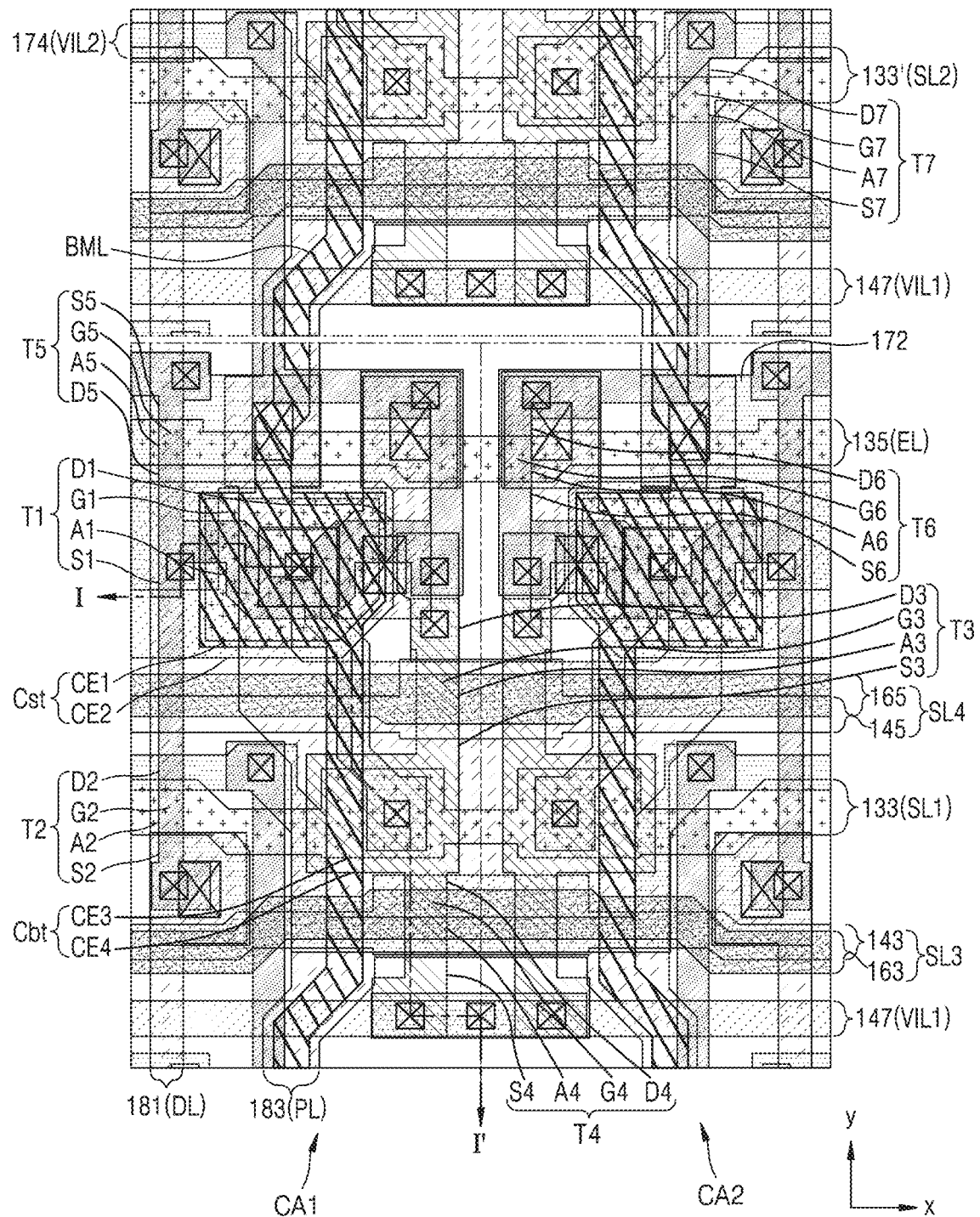
FIG. 5 is an arrangement view of an embodiment of the positions of a plurality of thin-film transistors ("TFT") and capacitors arranged in a pair of pixel circuits of a display apparatus.
Figure 6:
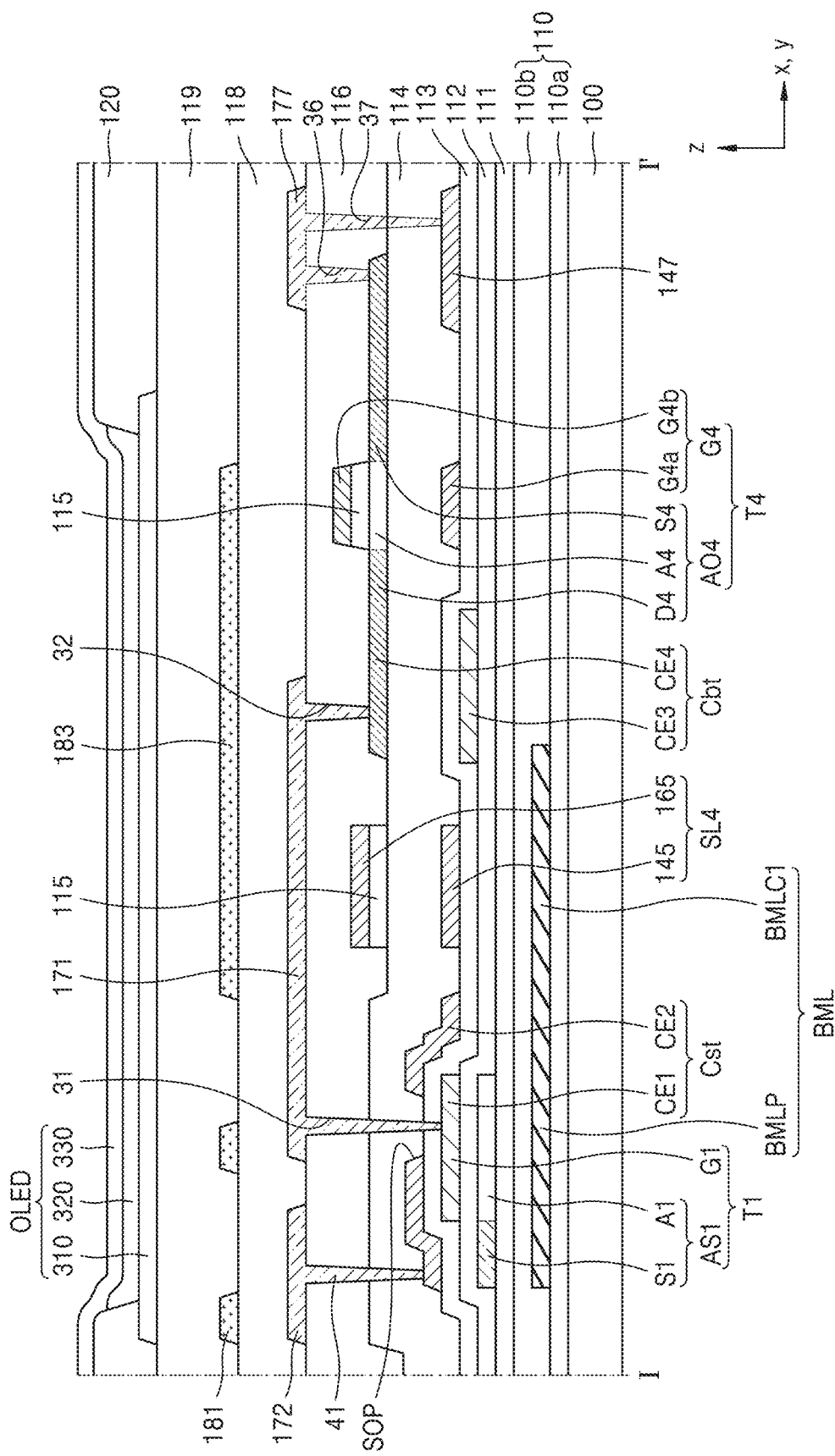
FIG. 6 is a cross-sectional view of an embodiment of the display apparatus, taken along line I-I' of FIG. 5.

FIG. 5 is an arrangement view of an embodiment of the positions of a plurality of thin-film transistors ("TFT") and capacitors arranged in a pair of pixel circuits of a display apparatus. FIG. 6 is a cross-sectional view of an embodiment of the display apparatus, taken along line I-I' of FIG. 5. FIGS. 7A to 7H are arrangement views of an embodiment of elements of FIG. 5 for each layer.

FIG. 5 shows a pair of pixels PX arranged on the same row of neighboring columns. A pixel circuit of a pixel arranged in a left pixel area CA1 shown in FIG. 5 and a pixel circuit of a pixel arranged in a right pixel area CA2 shown in FIG. 5 have a horizontally symmetric structure. FIG. 5 shows a pixel circuit to which the shield layer BML of FIGS. 3 and 4 is applied.

Referring to FIG. 5, a first scan line 133, a second scan line 133', a third scan line SL3, a fourth scan line SL4, an emission control line 135, a first initialization voltage line 147, and a second initialization voltage line 174 may extend in the x-direction and be apart from each other on each column. Data lines 181 may extend in the y-direction and be apart from each other on each column. A driving voltage line 183 may extend in the y-direction and include a portion arranged on each column and a portion shared by neighboring pixel circuits.

A pixel circuit may include the first transistor T1, the second transistor T2, the third transistor T3, the fourth transistor T4, the fifth transistor T5, the sixth transistor T6, the seventh transistor T7, the first capacitor Cst, and the second capacitor Cbt.

In an embodiment, the first transistor T1, the second transistor T2, the fifth transistor T5, the sixth transistor T6, and the seventh transistor T7 may each include a silicon-based TFT including a silicon semiconductor. The third transistor T3 and the fourth transistor T4 may include an oxide-based TFT including an oxide semiconductor.

The second scan line 133' may be the first scan line SL1 on a previous row or the next row. That is, the first scan line 133 shown in FIG. 5 may be the second scan line SL2 on the next row or the previous row. FIG. 5 shows an example in which the seventh transistor T7 arranged in a pixel area of the next row and connected to a pixel on a current row, and the seventh transistor T7 arranged in a pixel area of the current row and connected to a pixel on the previous row. Hereinafter, for convenience of illustration and description, the seventh transistor T7 arranged in a pixel area of the current row is described as an example.

The semiconductor layers of the first transistor T1, the second transistor T2, the fifth transistor T5, the sixth transistor T6, and the seventh transistor T7 are arranged on the same layer and include the same material. In an embodiment, the semiconductor layer may include polycrystalline silicon. The semiconductor layers of the first transistor T1, the second transistor T2, the fifth transistor T5, the sixth transistor T6, and the seventh transistor T7 may be connected to each other and bent in various shapes.

The semiconductor layers of the first transistor T1, the second transistor T2, the fifth transistor T5, the sixth transistor T6, and the seventh transistor T7 may each include a channel region, a source region, and a drain region, the source region and the drain region being respectively arranged on two opposite sides of the channel region. In an embodiment, the source region and the drain region may be doped with impurities. The impurities may be N-type impurities or P-type impurities. The source region and the drain region may respectively correspond to a source electrode and a drain electrode. The source region and the drain region may be exchanged with each other according to the property of the transistor. Hereinafter, terms such as a source region and a drain region may be used instead of a source electrode or a drain electrode.

The first transistor T1 may include a first semiconductor layer and a first gate electrode G1. The first semiconductor layer may include a first channel region A1, a first source region S1, and a first drain region D1, the first source region S1 and the first drain region D1 being on two opposite sides of the first channel region A1. The first semiconductor layer has a bent shape, and thus, the first channel region A1 may be longer than other channel regions A2 to A7. In an embodiment, because the first semiconductor layer has a shape that is bent multiple times, such as '└', '⌐', 'S', 'M', and 'W', a long channel length may be provided in a narrow space. Because the first channel region A1 is provided long, a driving range of a gate voltage applied to the first gate electrode G1 widens, and thus, a grayscale of light emitted from the organic light-emitting diode OLED may more elaborately controlled and display quality may be improved. In an embodiment, the first semiconductor layer may have a straight line shape rather than a bent shape. The first gate electrode G1 has an isolated shape and may overlap the first channel region A1 with a first gate insulating layer 112 (refer to FIG. 6) therebetween.

The first capacitor Cst may overlap the first transistor T1. The first capacitor Cst may include a first electrode CE1 and a second electrode CE2. The first gate electrode G1 may serve as the first electrode CE1 of the first capacitor Cst as well as a control electrode of the first transistor T1. That is, the first gate electrode G1 and the first electrode CE1 may be provided as one body. The second electrode CE2 of the first capacitor Cst may overlap the first electrode CE1 with a second gate insulating layer 113 (refer to FIG. 6) therebetween. In this case, the second gate insulating layer 113 may serve as a dielectric layer of the first capacitor Cst.

A node connection line 171 (refer to FIG. 6) may be electrically connected to the first electrode CE1 and a third semiconductor layer of the third transistor T3. The second electrode CE2 may be electrically connected to a connection electrode 172. The connection electrode 172 may be electrically connected to the driving voltage line 183.

The second transistor T2 may include a second semiconductor layer and a second gate electrode G2. The second semiconductor layer may include a second channel region A2, a second source region S2, and a second drain region D2, the second source region S2 and the second drain region D2 being on two opposite sides of the second channel region A2. The second source region S2 may be electrically connected to a data line 181, and the second drain region D2 may be connected to the first source region S1. The second gate electrode G2 may be provided as a portion of the first scan line 133.

The fifth transistor T5 may include a fifth semiconductor layer and a fifth gate electrode G5. The fifth semiconductor layer may include a fifth channel region A5, a fifth source region S5, and a fifth drain region D5, the fifth source region S5 and the fifth drain region D5 being on two opposite sides of the fifth channel region A5. The fifth source region S5 may be electrically connected to the connection electrode (also referred to as first power voltage line) 172, and the fifth drain region D5 may be connected to the first source region S1. The fifth gate electrode G5 may be provided as a portion of the emission control line 135.

The sixth transistor T6 may include a sixth semiconductor layer and a sixth gate electrode G6. The sixth semiconductor layer may include a sixth channel region A6, a sixth source region S6, and a sixth drain region D6, the sixth source region S6 and the sixth drain region D6 being on two opposite sides of the sixth channel region A6. The sixth source region S6 may be connected to the first drain region D1, and the sixth drain region D6 may be electrically connected to a pixel electrode 310 (refer to FIG. 6) of the organic light-emitting diode OLED. The sixth gate electrode G6 may be provided as a portion of the emission control line 135.

The seventh transistor T7 may include a seventh semiconductor layer and a seventh gate electrode G7. The seventh semiconductor layer may include a seventh channel region A7, a seventh source region S7, and a seventh drain region D7, the seventh source region S7 and the seventh drain region D7 being on two opposite sides of the seventh channel region A7. The seventh drain region D7 may be electrically connected to the second initialization voltage line 174, and the seventh source region S7 may be connected to the sixth drain region D6. The seventh gate electrode G7 may be provided as a portion of the second scan line 133'.

A first interlayer insulating layer 114 (refer to FIG. 6) may be arranged on the first transistor T1, the second transistor T2, the fifth transistor T5, the sixth transistor T6, and the seventh transistor T7 each including a silicon semiconductor. The third transistor T3 and the fourth transistor T4 each including an oxide semiconductor may be arranged on the first interlayer insulating layer 114.

The semiconductor layers of the third transistor T3 and the fourth transistor T4 may each include a channel region, a source region, and a drain region, the source region and the drain region being respectively on two opposite sides of the channel region. The source region and the drain region may respectively correspond to the source electrode and the drain electrode.

The third transistor T3 includes a third semiconductor layer and a third gate electrode G3, the third semiconductor layer including an oxide semiconductor. The third semiconductor layer may include a third channel region A3, a third source region S3, and a third drain region D3, the third source region S3 and the third drain region D3 being on two opposite sides of the third channel region A3. The third source region S3 may be bridge-connected to the first gate electrode G1 through the node connection line 171. In addition, the third source region S3 may be connected to the fourth drain region D4 arranged in the same layer as the third source region S3. The third drain D3 may be electrically connected to the first semiconductor layer of the first transistor T1 and the sixth semiconductor layer of the sixth transistor T6. The third gate electrode G3 may be provided as a portion of the fourth scan line SL4.

The fourth transistor T4 includes a fourth semiconductor layer and a fourth gate electrode G4, the fourth semiconductor layer including an oxide semiconductor. The fourth semiconductor layer may include a fourth channel region A4, a fourth source region S4, and a fourth drain region D4, the fourth source region S4 and the fourth drain region D4 being on two opposite sides of the fourth channel region A4. The fourth source region S4 may be electrically connected to the first initialization voltage line 147, and the fourth drain region D4 may be bridge-connected to the first gate electrode G1 through the node connection line 171. The fourth gate electrode G4 may be provided as a portion of the third scan line SL3.

A third gate insulating layer 115 (refer to FIG. 6) may be arranged between the third semiconductor layer and the third gate electrode G3 and between the fourth semiconductor layer and the fourth gate electrode G4 to correspond to each channel region.

The third electrode CE3 of the second capacitor Cbt may be provided as a portion of the first scan line 133 and connected to the second gate electrode G2. The fourth electrode CE4 of the second capacitor Cbt may overlap the third electrode CE3 and include an oxide semiconductor. The fourth electrode CE4 may be arranged in the same layer as the third semiconductor layer of the third transistor T3 and the fourth semiconductor layer of the fourth transistor T4. The fourth electrode CE4 may be arranged in a region between the third semiconductor layer and the fourth semiconductor layer. In an alternative embodiment, the fourth electrode CE4 may extend from the fourth semiconductor layer. In an alternative embodiment, the fourth electrode CE4 may extend from the third semiconductor layer.

In an embodiment, some of the wirings may be provided as two conductive layers arranged in different layers. In an embodiment, the third scan line SL3 may include a bottom scan line 143 and a top scan line 163 arranged in different layers. The bottom scan line 143 may be arranged in the same layer as the second electrode CE2 of the first capacitor Cst and may include the same material as that of the second electrode CE2. The top scan line 163 may be arranged on the third gate insulating layer 115 (refer to FIG. 6). The bottom scan line 143 may overlap at least a portion of the top scan line 163. Because the bottom scan line 143 and the top scan line 163 correspond to a portion of the third gate electrode G3 of the third transistor T3, the third transistor T3 may have a double gate structure that includes control electrodes respectively above and below the semiconductor layer.

In addition, the fourth scan line SL4 may include a bottom scan line 145 and a top scan line 165 arranged in different layers. The bottom scan line 145 may be arranged in the same layer as the second electrode CE2 of the first capacitor Cst and may include the same material as that of the second electrode CE2. The top scan line 165 may be arranged on the third gate insulating layer 115 (refer to FIG. 6). The bottom scan line 145 may overlap at least a portion of the top scan line 165. Because the bottom scan line 145 and the top scan line 165 correspond to a portion of the fourth gate electrode G4 of the fourth transistor T4, the fourth transistor T4 may have a double gate structure that includes control electrodes respectively above and below the semiconductor layer.

The first initialization voltage line 147 and the second initialization voltage line 174 may be arranged in different layers. The first initialization voltage line 147 may be arranged in the same layer as the second electrode CE2 of the first capacitor Cst and may include the same material as that of the second electrode CE2. The second initialization voltage line 174 may be arranged in the same layer as the connection electrode 172 and may include the same material as that of the connection electrode 172.

Hereinafter, the structure of the display apparatus in an embodiment is described in detail according to a stacking order with reference to FIGS. 6, 7A to 7H.

FIG. 6 shows a cross-section of a portion corresponding to the first transistor T1, the fourth transistor T4, the first capacitor Cst, the second capacitor Cbt, and the organic light-emitting diode OLED shown in FIG. 5. The stacking structure of the second transistor T2 and the fifth to seventh transistors T5, T6, and T7 may be the same as or similar to that of the first transistor T1. The stacking structure of the third transistor T3 may be the same as or similar to that of the fourth transistor T4.

The substrate 100 may include glass, a ceramic material, a metal material, or a flexible or bendable material. In the case where the substrate 100 is flexible or bendable, the substrate 100 may include a polymer resin such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"), for example.

The substrate 100 may have a single-layered structure or a multi-layered structure including the above materials. In an embodiment, the substrate 100 may have a stacking structure of a first base layer/a barrier layer/a second base layer. The first base layer and the second base layer may each be an organic layer including a polymer resin. The first base layer and the second base layer may each include a transparent polymer resin. The barrier layer is a barrier layer preventing penetration of external foreign substance and may include a single layer or a multi-layer including an inorganic material such as silicon nitride ($SiN_x$) or silicon oxide ($SiO_x$).

A buffer layer 111 may be arranged on the substrate 100. In an embodiment, the buffer layer 111 may raise the flatness of the top surface of the substrate 100 and include an oxide layer such as silicon oxide ($SiO_x$) and/or a nitride layer such as silicon nitride ($SiN_x$), or silicon oxynitride (SiON).

A barrier layer 110 may be further arranged between the substrate 100 and the buffer layer 111. The barrier layer 110 may prevent or reduce impurities from the substrate 100, etc., from penetrating into a silicon semiconductor layer. In an embodiment, the barrier layer 110 may include a single layer or a multi-layer including an inorganic material such as silicon nitride ($SiN_x$) or silicon oxide ($SiO_x$). The barrier layer 110 may include a first barrier layer 110a and a second barrier layer 110b.

Figure 7A:
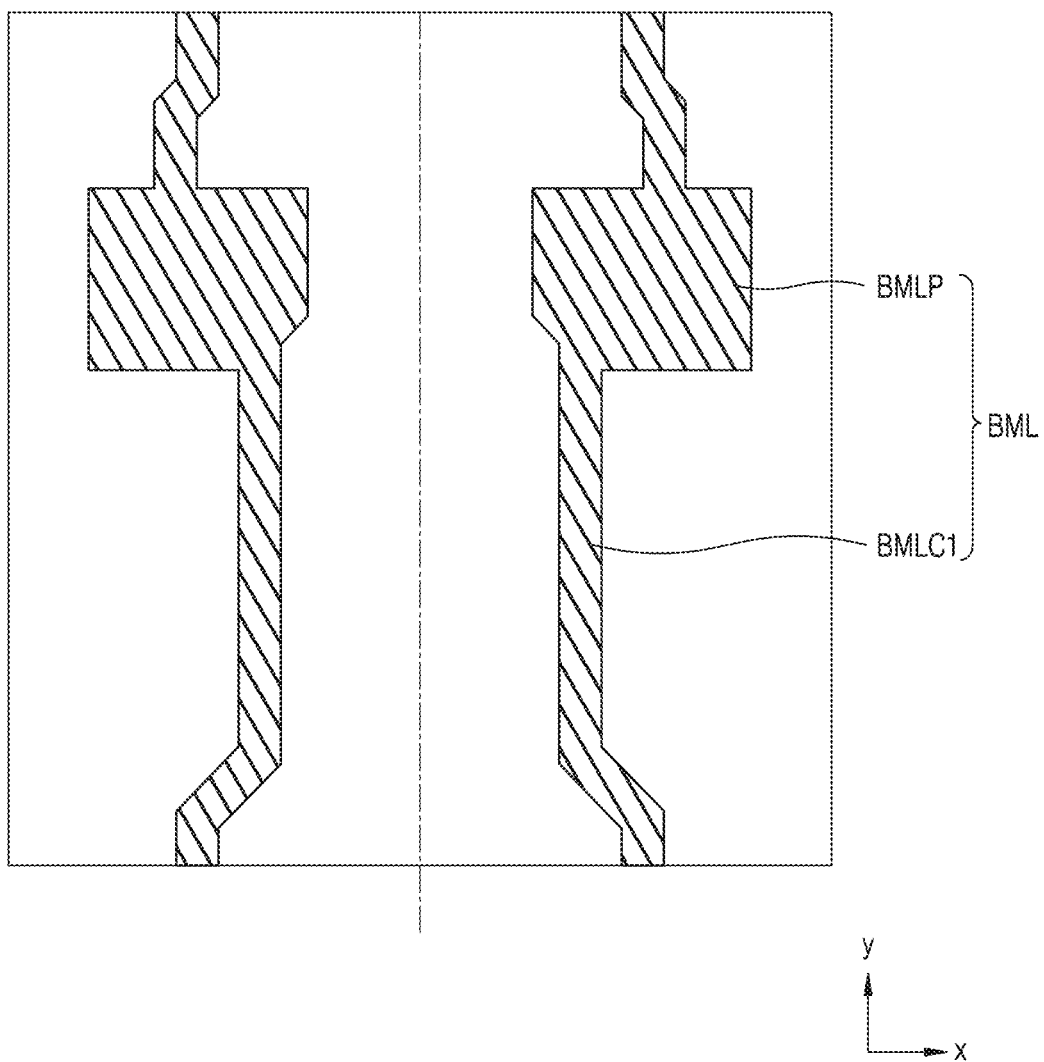
FIGS. 7A to 7H are arrangement views of an embodiment of elements of FIG. 5 for each layer.

As shown in FIG. 6, the shield layer BML, may be arranged between the first barrier layer 110a and the second barrier layer 110b. As shown in FIG. 7A, the shield layer BML may include the shield pattern BMLP and the first connection line BMLC1, the shield pattern BMLP being arranged to correspond to the first transistor T1, and the first connection line BMLC1 extending in the y-direction from the shield pattern BMLP. In another embodiment, the shield layer BML, may be arranged between the second barrier layer 110b and the buffer layer 111.

Figure 7B:
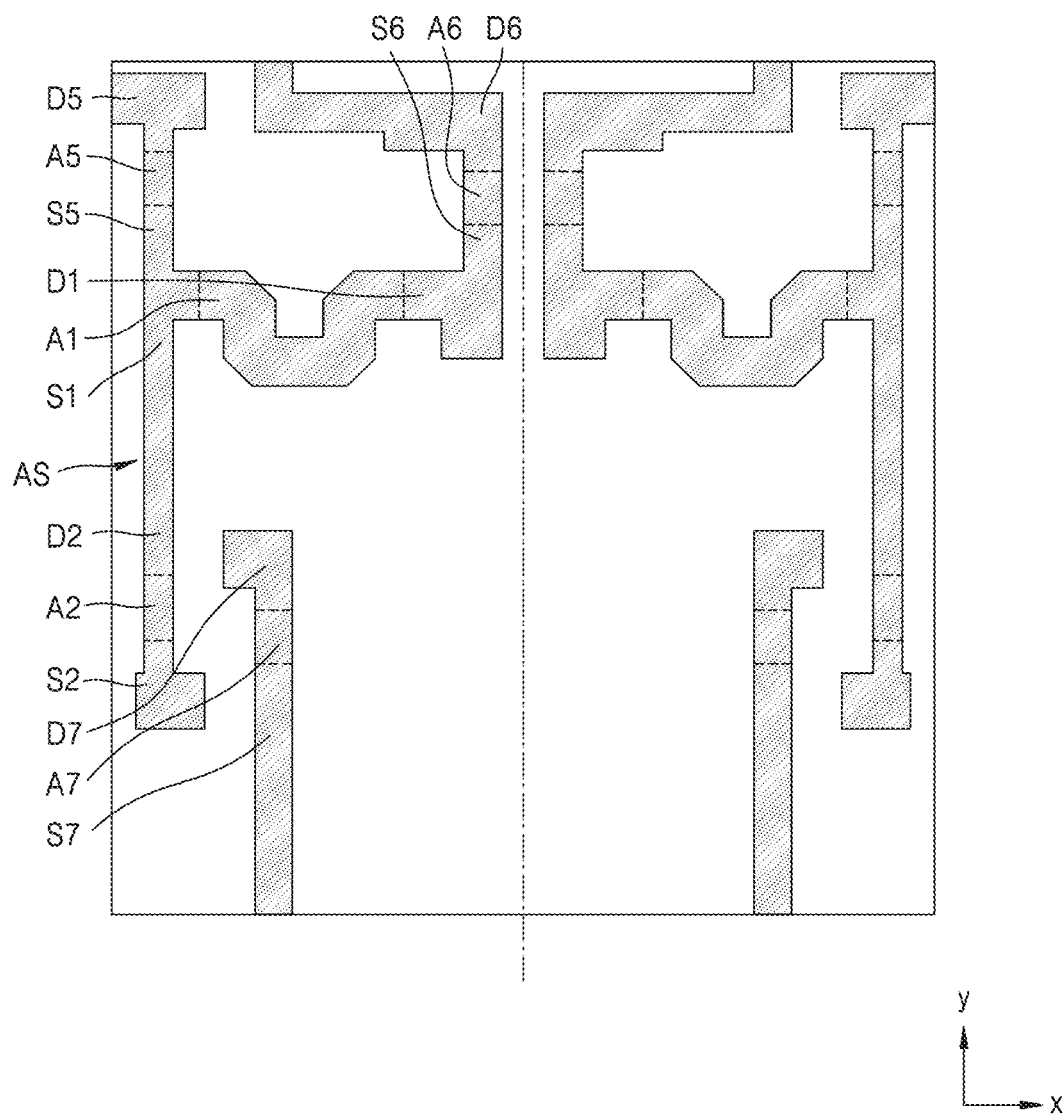

As shown in FIG. 7B, a semiconductor layer AS of the first transistor T1, the second transistor T2, the fifth transistor T5, the sixth transistor T6, and the seventh transistor T7 may be arranged on the buffer layer 111.

The semiconductor layer AS may include a first semiconductor layer AS1 of the first transistor T1 including the first channel region A1, the first source region S1 and the first drain region D1, a second semiconductor layer of the second transistor T2 including the second channel region A2, the second source region S2 and the second drain region D2 a fifth semiconductor layer AS5 of the fifth transistor T5 including the fifth channel region A5, the fifth source region S5 and the fifth drain region D5, a sixth semiconductor layer AS6 including the sixth channel region A6, the sixth source region S6 and the sixth drain region D6, and a seventh semiconductor layer of the seventh transistor T7 including the seventh channel region A7, the seventh source region S7 and the seventh drain region D7. That is, the channel region, the source region, and the drain region of each of the first to seventh transistors T1, T2, T3, T4, T5, T6, and T7 may be partial regions of the semiconductor layer AS.

In FIG. 7B, the semiconductor layers of the first transistor T1, the second transistor T2, the fifth transistor T5, and the sixth transistor T6 may be connected to each other. The seventh semiconductor layer of the seventh transistor T7 may be separately provided. This is because the seventh semiconductor layer of the seventh transistor T7 shown in FIG. 7B is a partial region of the semiconductor layer extending from a previous row. As shown in FIG. 5, the semiconductor layers of the first transistor T1, the second transistor T2, the fifth transistor T5, the sixth transistor T6, and the seventh transistor T7 that configure a pixel circuit of a current row may be one semiconductor layer in which the semiconductor layers are connected to each other.

The first gate insulating layer 112 may be arranged on the semiconductor layer AS. The first gate insulating layer 112 may include an inorganic material including oxide or nitride. In an embodiment, the first gate insulating layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), for example.

Figure 7C:
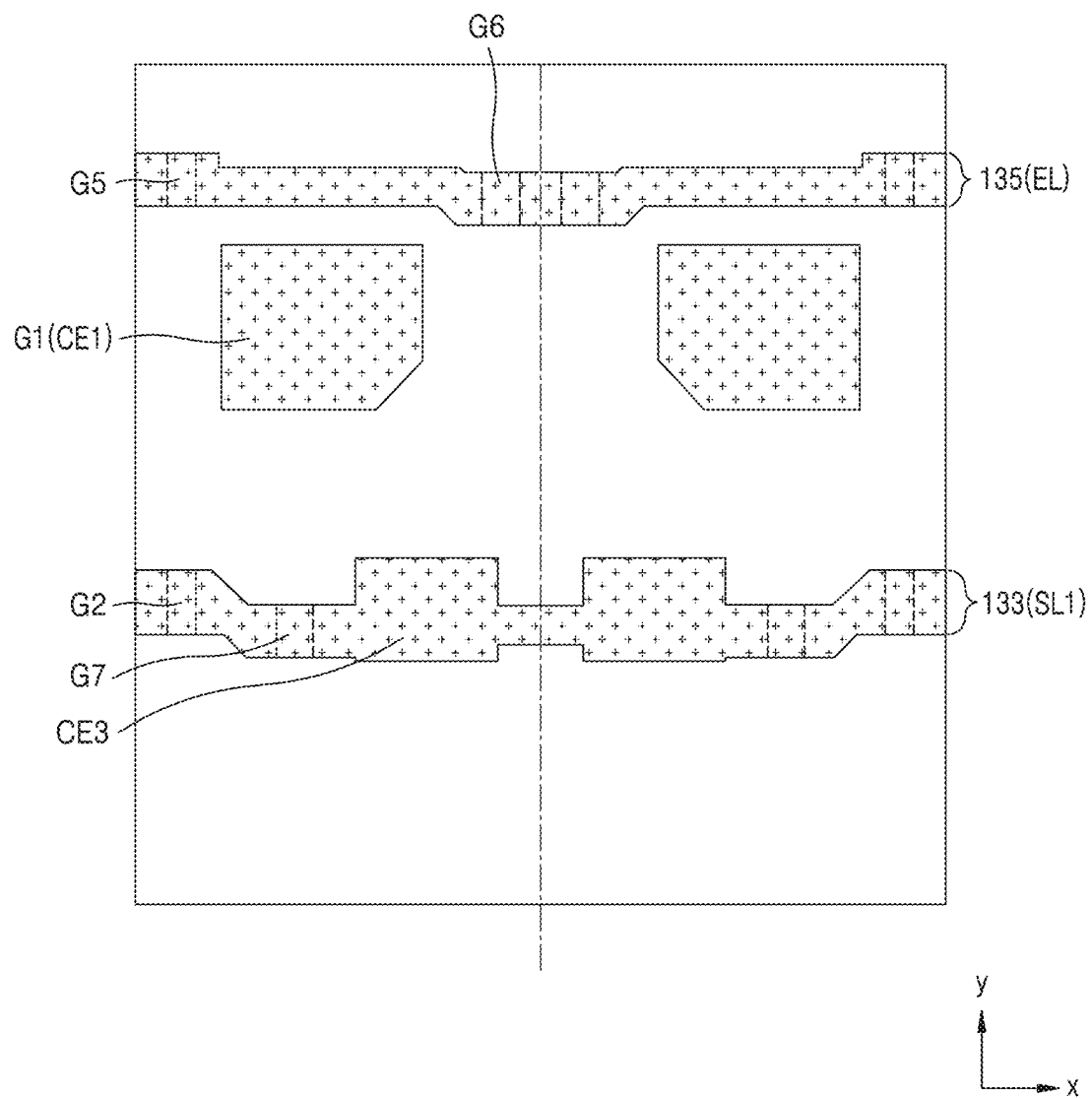

As shown in FIG. 7C, the first gate electrode G1 of the first transistor T1, the second gate electrode G2 of the second transistor T2, the fifth gate electrode G5 of the fifth transistor T5, the sixth gate electrode G6 of the sixth transistor T6, and the seventh gate electrode G7 of the seventh transistor T7 may be arranged on the first gate insulating layer 112. In addition, the first scan line 133 and the emission control line 135 may be arranged on the first gate insulating layer 112 and may extend in the x-direction. A portion of the first scan line 133 may be the third electrode CE3 of the second capacitor Cbt.

The first gate electrode G1 of the first transistor T1 may be provided as an isolated shape. The second gate electrode G2 of the second transistor T2 may be a portion of the first scan line 133 that crosses the semiconductor layer AS. The seventh gate electrode G7 of the seventh transistor T7 may be a portion of the first scan line 133 that crosses the semiconductor layer AS, or a portion of the second scan line 133' (refer to FIG. 5), which is the first scan line on the next row. FIG. 7C shows an example in which the seventh gate electrode G7 of the seventh transistor T7 of a pixel arranged on a previous row is a portion of the first scan line 133 that crosses the semiconductor layer AS. The fifth gate electrode G5 of the fifth transistor T5 and the sixth gate electrode G6 of the sixth transistor T6 may be portions of the emission control line 135 that cross the semiconductor layer AS.

The first gate electrode G1 of the first transistor T1 may serve as the first electrode CE1 of the first capacitor Cst as well as the control electrode of the first transistor T1.

In an embodiment, the gate electrodes of the first transistor T1, the second transistor T2, the fifth transistor T5, the sixth transistor T6, and the seventh transistor T7 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and include a single layer or a multi-layer including the at least one material, for example.

The second gate insulating layer 113 may be arranged on the gate electrodes. The second gate insulating layer 113 may include an inorganic material including oxide or nitride. In an embodiment, the second gate insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), for example.

Figure 7D:
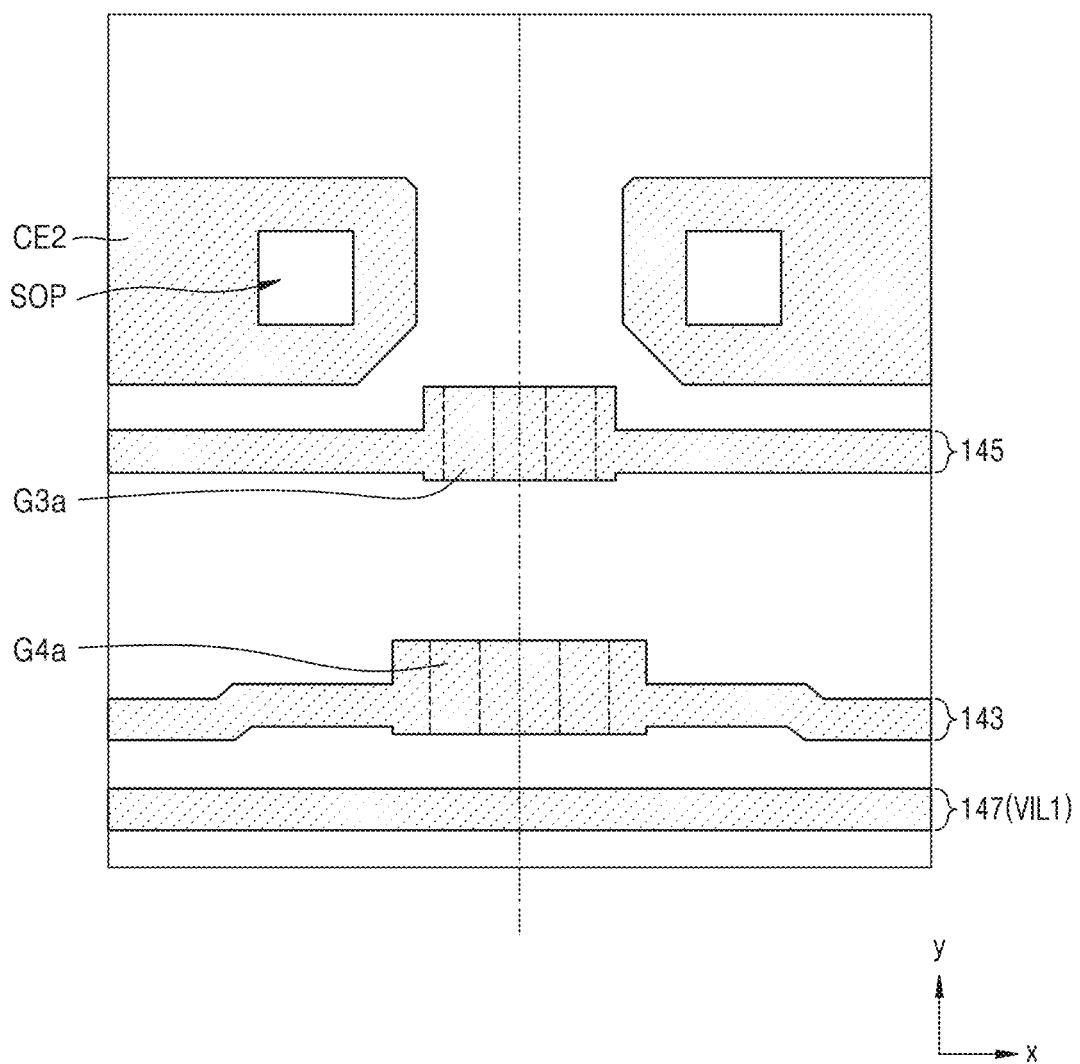

As shown in FIG. 7D, the second electrode CE2 may be arranged on the second gate insulating layer 113 to overlap the first electrode CE1. An opening SOP may be defined in the second electrode CE2. The opening SOP is defined by removing a portion of the second electrode CE2 and may have a closed shape. The second gate insulating layer 113 may serve as a dielectric layer of the first capacitor Cst.

In an embodiment, the second electrode CE2 of the first capacitor Cst may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and include a single layer or a multi-layer including the at least one material, for example.

The first initialization voltage line 147, the bottom scan line 143 of the third scan line SL3, and the bottom scan line 145 of the fourth scan line SL4 may be arranged on the second gate insulating layer 113, may extend in the x-direction, and include the same material as that of the second electrode CE2 of the first capacitor Cst. A portion of the bottom scan line 143 of the third scan line SL3 that overlaps a semiconductor layer AO (refer to FIG. 7E) may be a bottom gate electrode G4a of the fourth transistor T4. A portion of the bottom scan line 145 of the fourth scan line SL4 that overlaps the semiconductor layer AO may be a bottom gate electrode G3a of the third transistor T3.

The first interlayer insulating layer 114 may be arranged on the second electrode CE2 of the first capacitor Cst. The first interlayer insulating layer 114 may include an inorganic material including oxide or nitride. In an embodiment, the first interlayer insulating layer 114 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), for example.

Figure 7E:
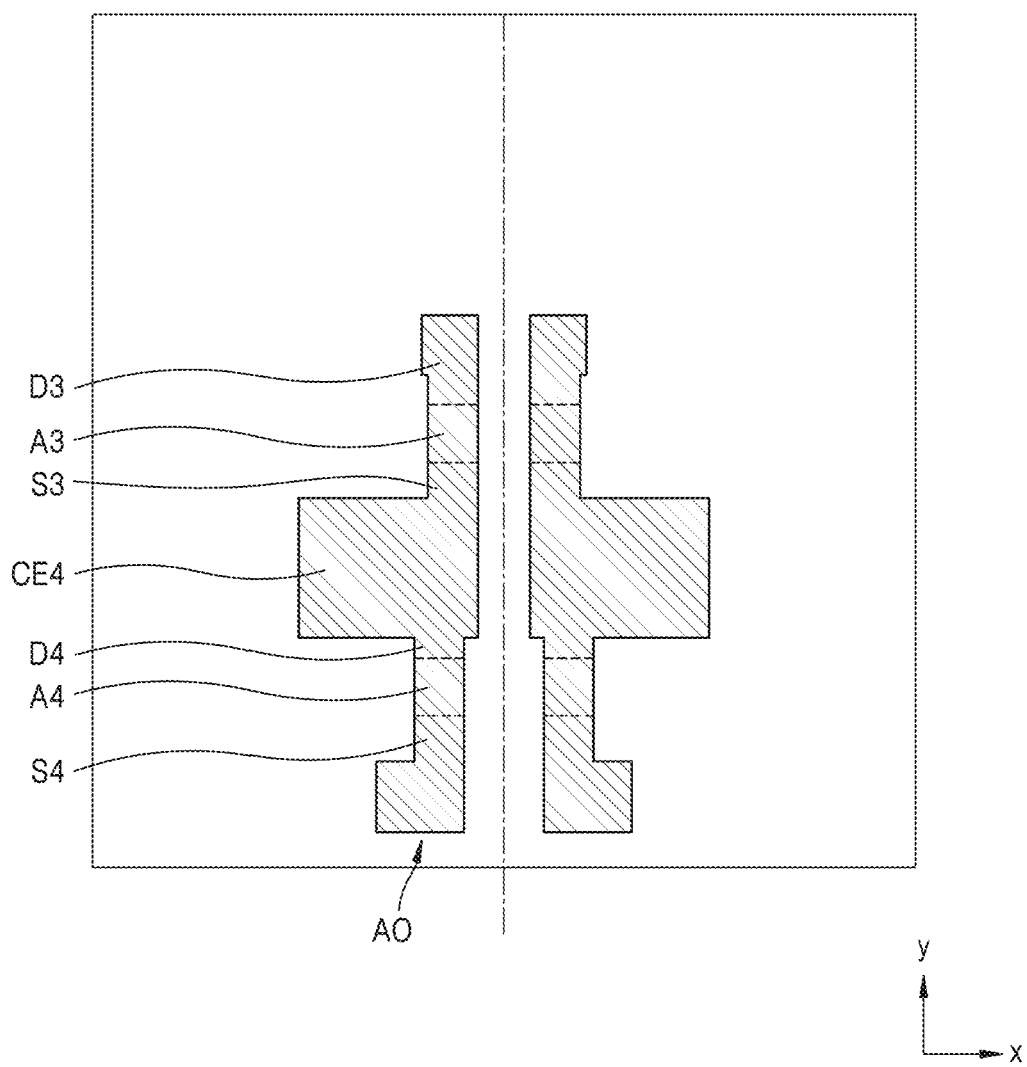

As shown in FIG. 7E, the semiconductor layer AO including an oxide semiconductor may be arranged on the first interlayer insulating layer 114. The semiconductor layer AO may include Zn-oxide-based material and include Zn-oxide, In—Zn oxide, and Ga—In—Zn oxide. In an embodiment, the semiconductor layer AO may include In—Ga—Zn—O ("IGZO"), In—Sn—Zn—O ("ITZO"), or In—Ga—Sn—Zn—O ("IGTZO") semiconductor including metal such as indium (In), gallium (Ga), or stannum (Sn) in ZnO.

The semiconductor layers of the third transistor T3 and the fourth transistor T4 may each include a channel region, a source region, and a drain region, the source region and the drain region being respectively on two opposite sides of the channel region. The source region and the drain region of the third transistor T3 and the fourth transistor T4 may be provided by adjusting carrier concentration of an oxide semiconductor and making the source region and the drain region conductive. In an embodiment, the source region and the drain region of the third transistor T3 and the fourth transistor T4 may be provided by increasing carrier concentration through plasma treatment that uses a hydrogen (H)-based gas, a fluorine (F)-based gas, or a combination of these performed on the oxide semiconductor, for example.

The semiconductor layer AO may include a third semiconductor layer of the third transistor T3 including the third channel region A3, the third source region S3 and the third drain region D3, and a fourth semiconductor layer AO4 of the fourth transistor T4 including the fourth channel region A4, the fourth source region S4 and the fourth drain region D4. That is, the channel region, the source region, and the drain region of each of the third transistor T3 and the fourth transistor T4 may be partial regions of the semiconductor layer AO. The fourth source region S4 of the fourth transistor T4 may overlap the first initialization voltage line 147.

The semiconductor layer AO may include the fourth electrode CE4 of the second capacitor Cbt. The fourth electrode CE4 of the second capacitor Cbt may be arranged between the third semiconductor layer of the third transistor T3 and the fourth semiconductor layer AO4 of the fourth transistor T4. The fourth electrode CE4 may extend from the third semiconductor layer of the third transistor T3 or the fourth semiconductor layer AO4 of the fourth transistor T4. That is, the fourth electrode CE4 may include an oxide semiconductor and be arranged on the first interlayer insulating layer 114. The second gate insulating layer 113 and the first interlayer insulating layer 114 may be arranged between the third electrode CE3 and the fourth electrode CE4 of the second capacitor Cbt. The second gate insulating layer 113 and the first interlayer insulating layer 114 may serve as a dielectric layer of the second capacitor Cbt.

Figure 7F:
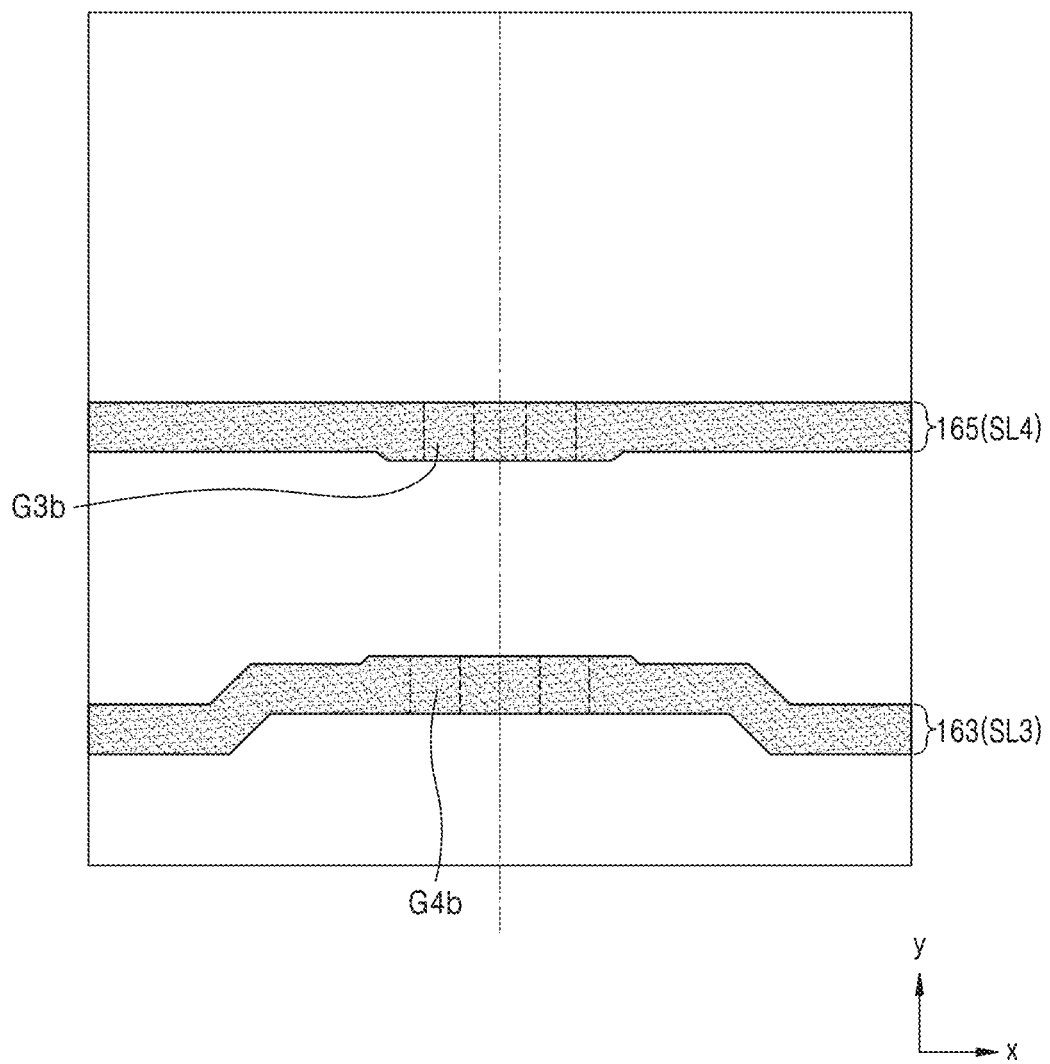

As shown in FIG. 7F, the top scan line 163 of the third scan line SL3 and the top scan line 165 of the fourth scan line SL4 may be arranged on the semiconductor layer AO and may extend in the x-direction. That is, the third scan line SL3 and the fourth scan line SL4 may include two conductive layers arranged in different layers.

The top scan line 163 of the third scan line SL3 may overlap at least a portion of the bottom scan line 143. The top scan line 165 of the fourth scan line SL4 may overlap at least a portion of the bottom scan line 145. The third gate insulating layer 115 may be arranged between the semiconductor layer AO and the top scan line 163 of the third scan line SL3 and between the semiconductor layer AO and the top scan line 165 of the fourth scan line SL4. The third gate insulating layer 115 may be patterned to correspond to the top scan line 163 of the third scan line SL3 and the top scan line 165 of the fourth scan line SL4.

A portion of the top scan line 163 of the third scan line SL3 that overlaps the fourth semiconductor layer AO4 may be a top gate electrode G4b of the fourth transistor T4. A portion of the top scan line 165 of the fourth scan line SL4 that overlaps the third semiconductor layer may be a top gate electrode G3b of the third transistor T3. That is, the third transistor T3 and the fourth transistor T4 may each have a double gate structure that includes control electrodes respectively above and below the semiconductor layer.

The third gate insulating layer 115 may include an inorganic material including oxide or nitride. In an embodiment, the third gate insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), for example. In an embodiment, the top gate electrode G3b of the third transistor T3 and the top gate electrode G4b of the fourth transistor T4 may be arrange on the third gate insulating layer 115, may include at least one of molybdenum (Mo), copper (Cu), and titanium (Ti), and include a single layer or a multi-layer, for example.

Figure 7G:
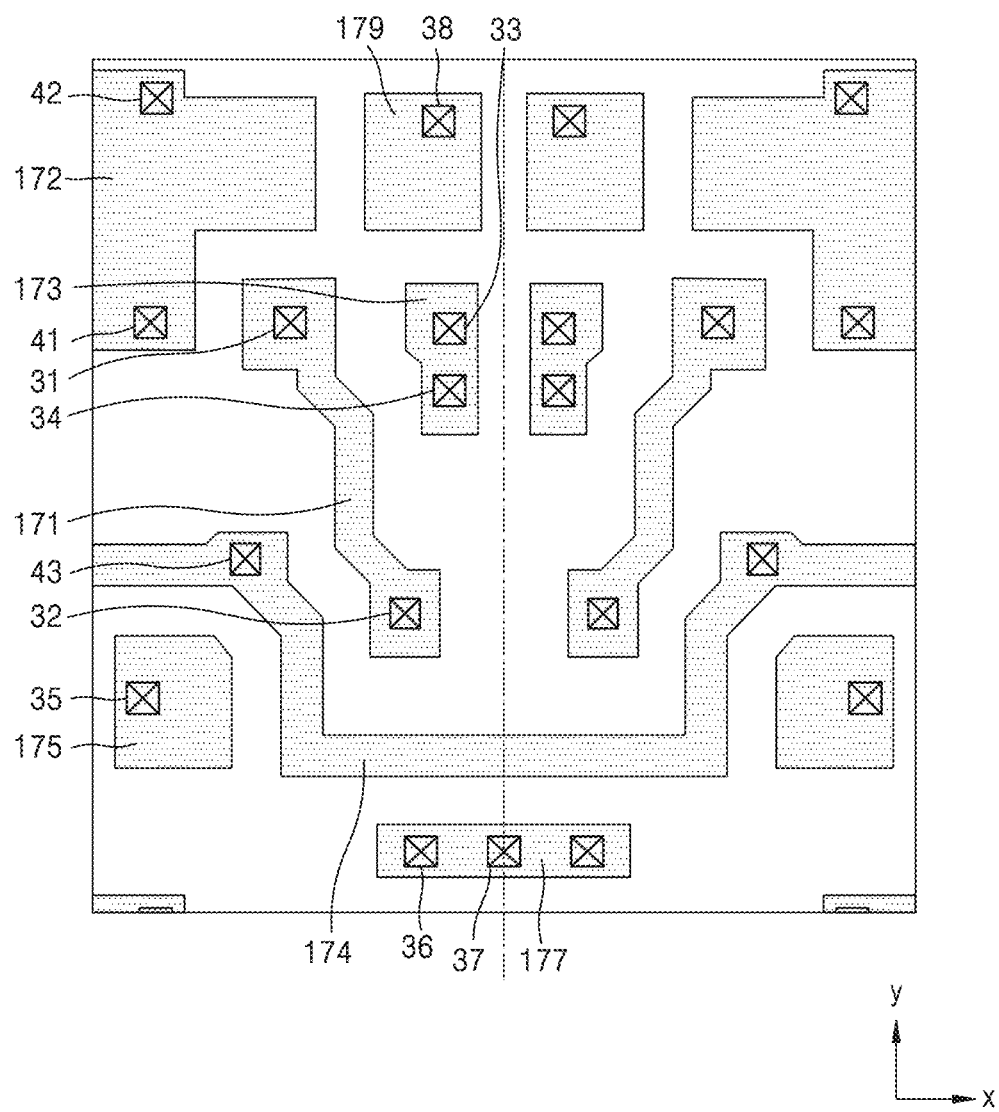

The second interlayer insulating layer 116 may cover the third transistor T3 and the fourth transistor T4. The second interlayer insulating layer 116 may be arranged on the top gate electrode G3b of the third transistor T3 and the top gate electrode G4b of the fourth transistor T4. As shown in FIG. 7G, the second initialization voltage line 174, the node connection line 171, connection electrodes 172, 173, 175, 177, and 179 may be arranged on the second interlayer insulating layer 116.

The second gate insulating layer 116 may include an inorganic material including oxide or nitride. In an embodiment, the second gate insulating layer 116 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), for example.

The second initialization voltage line 174, the node connection line 171, connection electrodes 172, 173, 175, 177, and 179 may include a material having high conductivity such as metal and conductive oxide. In an embodiment, the second initialization voltage line 174, the node connection line 171, connection electrodes 172, 173, 175, 177, and 179 may include a single layer or a multi-layer including at least one of aluminum (Al), copper (Cu), and titanium (Ti), for example. In an embodiment, the second initialization voltage line 174, the node connection line 171, connection electrodes 172, 173, 175, 177, and 179 may include a triple layer of titanium (Ti)/aluminum (Al)/titanium (Ti) that are sequentially arranged, for example.

The second initialization voltage line 174 may be connected to the seventh drain region D7 of the seventh transistor T7 through a contact hole 43 defined in the first gate insulating layer 112, the second gate insulating layer 113, the first interlayer insulating layer 114, and the second interlayer insulating layer 116.

One end of the node connection line 171 may be connected to the first gate electrode G1 through a contact hole 31. The contact hole 31 may pass through the second interlayer insulating layer 116, the first interlayer insulating layer 114, and the second gate insulating layer 113, and expose the first gate electrode G1. A portion of the node connection line (also referred to as a node connection electrode) 171 may be inserted into the contact hole 31 and electrically connected to the first gate electrode G1.

The contact hole 31 may be apart from the edge of the opening SOP inside the opening SOP of the second electrode CE2. The node connection line 171 inserted into the contact hole 31 may be electrically insulating from the second electrode CE2.

Another end of the node connection line 171 may be connected to an oxide semiconductor layer, for example, the fourth electrode CE4 of the second capacitor Cbt, the fourth semiconductor layer AO4, or the third semiconductor layer through a contact hole 32. The contact hole 32 may pass through the second interlayer insulating layer 116 and expose an oxide semiconductor layer.

The fourth electrode CE4 of the second capacitor Cbt may be connected to the node connection line 171, and thus, electrically connected to the first gate electrode G1. Accordingly, when a first scan signal Sn supplied to the first scan line SL1 is a turn-off voltage, the second capacitor Cbt may raise the voltage of the second node N2 (refer to FIG. 2) to clearly express a black grayscale.

The connection electrode 172 may be connected to the second electrode CE2 of the first capacitor Cst through a contact hole 41 defined in the first interlayer insulating layer 114 and the second interlayer insulating layer 116. The connection electrode 172 may be connected to the fifth drain region D5 of the fifth transistor T5 through a contact hole 42 defined in the first gate insulating layer 112, the second gate insulating layer 113, the first interlayer insulating layer 114, and the second interlayer insulating layer 116.

The one end of the connection electrode 173 may be connected to the first drain region D1 of the first transistor T1 and the sixth source region S6 of the sixth transistor T6 through a contact hole 33. The contact hole 33 may pass through the first gate insulating layer 112, the second gate insulating layer 113, the first interlayer insulating layer 114, and the second interlayer insulating layer 116 to expose the silicon semiconductor layer. Another end of the connection electrode 173 may be connected to the third drain region D3 of the third transistor T3 through a contact hole 34. The contact hole 34 may pass through the second interlayer insulating layer 116 to expose an oxide semiconductor layer.

The connection electrode 175 may be connected to the second source region S2 of the second transistor T2 through a contact hole 35 defined in the first gate insulating layer 112, the second gate insulating layer 113, the first interlayer insulating layer 114, and the second interlayer insulating layer 116.

A portion of the connection electrode 177 may be connected to the fourth source region S4 of the fourth transistor T4 through a contact hole 36 defined in the second interlayer insulating layer 116. Another portion of the connection electrode 177 may be connected to the first initialization voltage line 147 through a contact hole 37 defined in the first interlayer insulating layer 114 and the second interlayer insulating layer 116.

The connection electrode 179 may be connected to the drain region D6 of the sixth transistor T6 through a contact hole 38 defined in the first gate insulating layer 112, the second gate insulating layer 113, the first interlayer insulating layer 114, and the second interlayer insulating layer 116.

A first planarization layer 118 may be arranged on the second initialization voltage line 174, the node connection line 171, and the connection electrodes 172, 173, 175, 177, and 179.

Figure 7H:
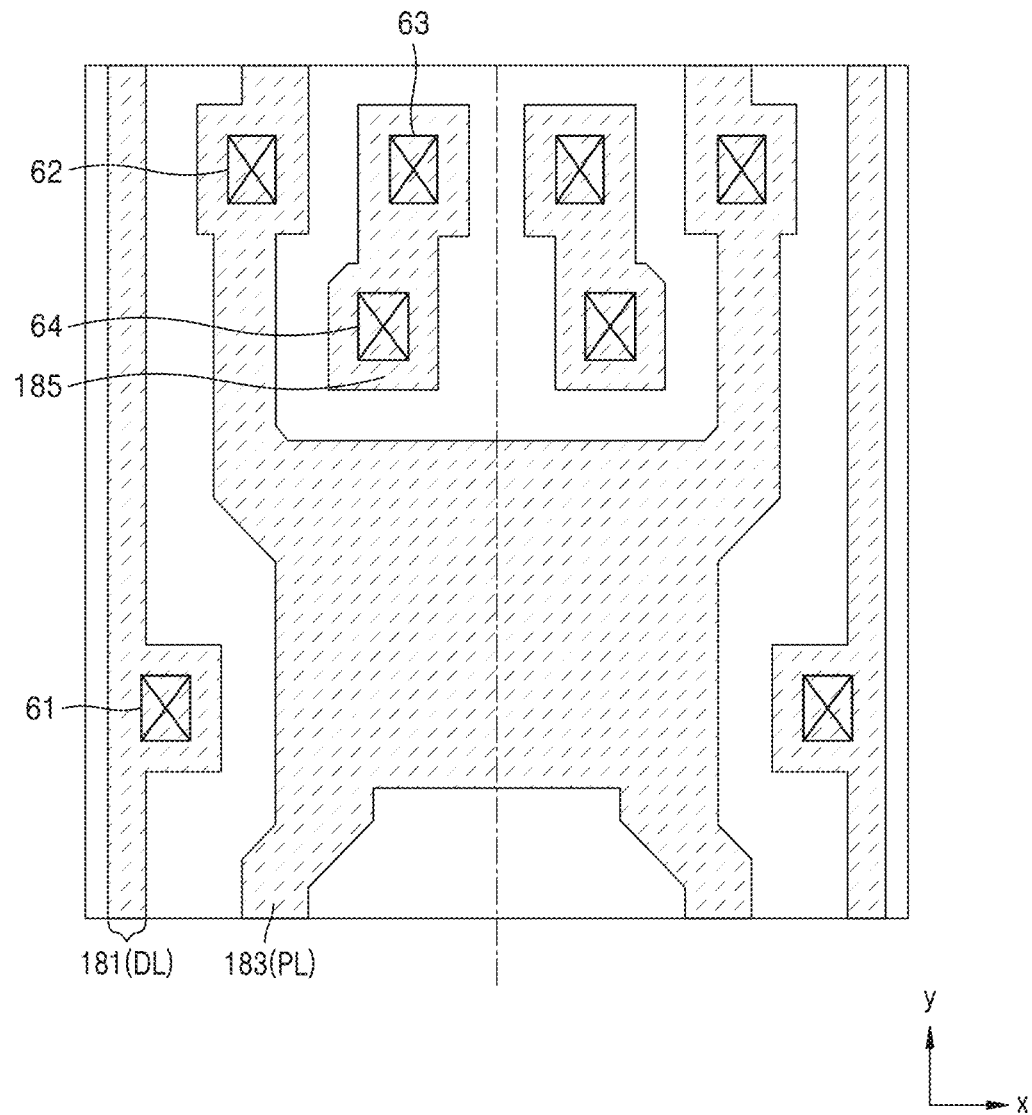

As shown in FIG. 7H, the data line 181, the driving voltage line 183, and a connection electrode 185 may be arranged on the first planarization layer 118.

The data line 181 is connected to the connection electrode 175 through a contact hole 61 defined in the first planarization layer 118, and thus, may be connected to the source region S2 of the second transistor T2.

The driving voltage line 183 may be connected to the connection electrode 172 through a contact hole 62 defined in the first planarization layer 118.

The connection electrode 185 is connected to the connection electrode 179 through a contact hole 63 defined in the first planarization layer 118, and thus, may be connected to the drain region D6 of the sixth transistor T6. The connection electrode 185 may be connected to the pixel electrode 310 through a contact hole 64 defined in a second planarization layer 119 on the first planarization layer 118 to transfer a signal applied through the sixth transistor T6 to the pixel electrode 310.

In an embodiment, the first planarization layer 118 and the second planarization layer 119 may each include an organic material such as benzocyclobutene ("BCB"), polyimide, or hexamethyldisiloxane ("HMDSO"). In an alternative embodiment, the first planarization layer 118 and the second planarization layer 119 may include an inorganic material. The first planarization layer 118 and the second planarization layer 119 serve as a protective layer covering the first to seventh transistors T1, T2, T3, T4, T5, T6, and T7. The top surfaces of the first planarization layer 118 and the second planarization layer 119 are provided to be flat. The first planarization layer 118 and the second planarization layer 119 may each be a single layer or a multi-layer.

A pixel-defining layer 120 may be arranged on the second planarization layer 119. The pixel-defining layer 120 defines a pixel by including an opening that corresponds to each pixel, that is, an opening that exposes a portion of the pixel electrode 310. In addition, the pixel-defining layer 120 prevents an arc, etc., from occurring at the edges of the pixel electrode 310 by increasing a distance between the edges of the pixel electrode 310 and an opposite electrode 330 over the pixel electrode 310. In an embodiment, the pixel-defining layer 120 may include an organic material such as polyimide or HMDSO.

An intermediate layer 320 of the organic light-emitting diode OLED may include a low molecular weight material or a polymer material. In the case where the intermediate layer 320 includes a low molecular weight material, the intermediate layer 320 may have a structure in which a hole injection layer ("HIL"), a hole transport layer ("HTL"), an emission layer ("EML"), an electron transport layer ("ETL"), an electron injection layer ("EIL"), etc., are stacked in a single or composite configuration. In an embodiment, the intermediate layer 320 may include various organic materials such as copper phthalocyanine (CuPc), N, N'-Di (naphthalene-1-yl)-N, N'-diphenyl-benzidine ("NPB"), or tris-8-hydroxyquinoline aluminum (Alq3), for example. These layers may be provided through vacuum deposition.

In the case where the intermediate layer 320 includes a polymer material, the intermediate layer 320 may generally have a structure including an HTL and an EML. In this case, the HTL may include poly-3, 4-ethylene dioxy thiophene ("PEDOT"), and the EML may include a polymer material such as a polyphenylene vinylene ("PPV")-based material and/or a polyfluorene-based material, for example.

The intermediate layer 320 is not limited thereto and may have various structures. In addition, the intermediate layer 320 may include a layer which is one body over a plurality of pixel electrodes 310 or include a layer patterned to correspond to each of the plurality of pixel electrodes 310.

The opposite electrodes 330 may be provided as one body over a plurality of organic light-emitting diodes to correspond to the plurality of pixel electrodes 310.

The organic light-emitting diodes OLED may be easily damaged by external moisture or oxygen. Accordingly, a thin-film encapsulation layer (not shown) or an encapsulation substrate (not shown) may be arranged on the organic light-emitting diodes OLED to protect the organic light-emitting diodes OLED. The thin-film encapsulation layer may cover the display area DA and extend to the outer side of the display area DA. The thin-film encapsulation layer may include at least one inorganic encapsulation layer and at least one organic encapsulation layer, the inorganic encapsulation layer including an inorganic material, and the organic encapsulation layer including an organic material. In an embodiment, the thin-film encapsulation layer may have a stacking structure of a first inorganic encapsulation layer/ an organic encapsulation layer/a second inorganic encapsulation layer. The encapsulation substrate (not shown) may be arranged to face the substrate 100 and bonded to the substrate 100 through a sealing member such as sealant or frit in the peripheral area PA.

A spacer for preventing mask chopping may be further arranged on the pixel-defining layer 120. Various functional layers such as a polarizing layer for reducing external light reflection, a black matrix, a color filter, and/or a touchscreen layer including a touch electrode, etc., may be arranged on the thin-film encapsulation layer.

Figure 8:
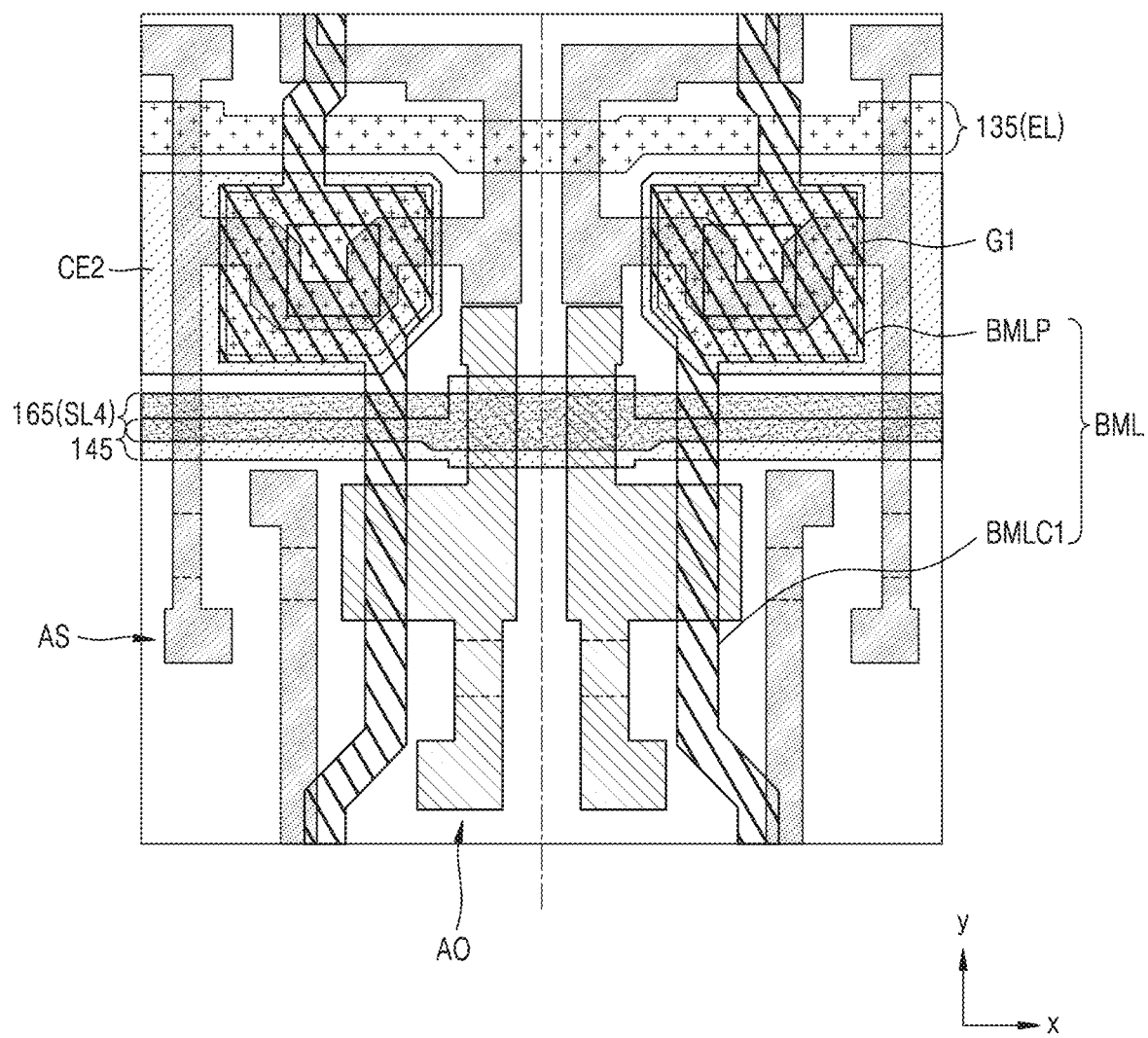
FIG. 8 is an arrangement view of an embodiment of only a portion of FIG. 5.

FIG. 8 is an arrangement view of an embodiment of only a portion of FIG. 5.

FIG. 8 shows a portion of a pixel circuit of a pixel arranged in a left pixel area CA1 shown in FIG. 5 and a portion of a pixel circuit of a pixel arranged in a right pixel area CA2 shown in FIG. 5, and mainly shows the shield layer BML and a structure therearound.

Referring to FIG. 8, the shield layer BML may be arranged in the display area DA and may overlap the pixel circuit. The shield layer BML may include shield patterns BMLP overlap a silicon-based transistor from among the pixel circuit. In an embodiment, each of the shield patterns BMLP may overlap the first transistor T1 of the pixel circuit. In this case, the shield pattern BMLP may not overlap the other transistors T2, T3, T4, T5, T6, and T7 except for the first transistor T1.

In an area of the display area DA in which a sensor SU (refer to FIG. 1), a component, etc., are arranged below the substrate 100, and an adjacent area thereof, after the sensor SU and the component are driven, external light and/or light emitted from the component, etc., may reach the first transistor T1 and light afterimage may occur. In this case, element characteristics, for example, a voltage-current characteristic of the first transistor T1 may change. A degree by which a voltage-current characteristic of the first transistor T1 changes may change according to the intensity of light reaching the first transistor T1, duration during which the first transistor T1 is exposed to light, etc. This hinders a precise control of the grayscale of light emitted from a display element, and thus, the display element may emit light of an undesired grayscale.

In contrast, in an embodiment, the shield layer BML overlapping the semiconductor layer of the first transistor T1 is arranged below the first transistor T1, particularly, below the semiconductor layer of the first transistor T1, and thus, it may be reduced that the first transistor T1 is influenced by light. Accordingly, the first transistor T1 has a stable voltage-current characteristic, and thus, deterioration of display quality may be prevented.

In addition, mobile charge is induced to an organic layer (e.g., the second base layer) of the substrate 100 by a voltage that changes while the display apparatus 1 is driven, which forms a back channel below a semiconductor layer of a transistor (particularly, the driving transistor), and thus, may influence the characteristics of the driving transistor. In an embodiment, in the case where a (−) voltage is applied to both the emission control line 135 and the fourth scan line SL4 respectively arranged over and below the first transistor T1 in a plan view of FIG. 5, the fourth scan line SL4 controlling the third transistor T3, which is an oxide-based transistor, (+) charge may gather on an interface of the second base layer. Accordingly, an electric field may be generated and (−) charge may gather below the semiconductor layer of the first transistor T1. Accordingly, a back channel may be provided below the semiconductor layer of the first transistor T1 and a voltage-current characteristic of the first transistor T1 may be changed.

In contrast, in an embodiment, the shield layer BML, overlapping the semiconductor layer of the first transistor T1 is arranged below the first transistor T1, particularly, below the semiconductor layer of the first transistor T1, and thus, an electric field that may influence the first transistor T1 may be effectively shielded.

In an embodiment, the shield layer BML may include amorphous silicon, for example, amorphous silicon doped with impurities. In an embodiment, the shield layer BML may include a p-type amorphous silicon in which pure amorphous silicon is doped with impurities such as aluminum (Al), boron (B), or indium (In). In another embodiment, the shield layer BML may include an n-type amorphous silicon in which pure amorphous silicon is doped with impurities such as phosphor (P), arsenic (As), or stibium (Sb). The shield layer BML may have a relatively low light transmittance by including amorphous silicon doped with impurities. Because the shield layer BML includes amorphous silicon, the shield layer BML may be electrically stable relatively even though a separate constant voltage is not applied thereto.

In another embodiment, the shield layer BML may include a metal material such as chrome (Cr) or molybdenum (Mo), black ink, and/or dye.

In addition, in an embodiment, a constant voltage is applied to the shield layer BML and the shield layer BML is not electrically floated. The electric characteristic of transistors on the shield layer BML, for example, the first transistors T1, which are driving transistors may be stabilized. A voltage applied to the shield layer BML may be the driving voltage ELVDD.

Though it is shown in FIG. 8 that the shield pattern BMLP has a quadrangular shape in a plan view, the invention is not limited thereto, and the shield pattern BMLP may have various shapes such as polygons, polygons having a round edge, a circular shape, and an elliptical shape. The planar area of the shield pattern BMLP may be greater than the planar area of the gate electrode of the silicon-based transistor overlapping the shield pattern BMLP. In an embodiment, the shield pattern BMLP may have an area greater than the area of the first gate electrode G1 of the first transistor T1.

A capacitor may be provided by a mutual overlapping area of the first gate electrode G1 of the first transistor T1 and the shield pattern BMLP to which the driving voltage ELVDD is applied. Accordingly, the capacitance of the first capacitor Cst may be increased.

Figure 9:
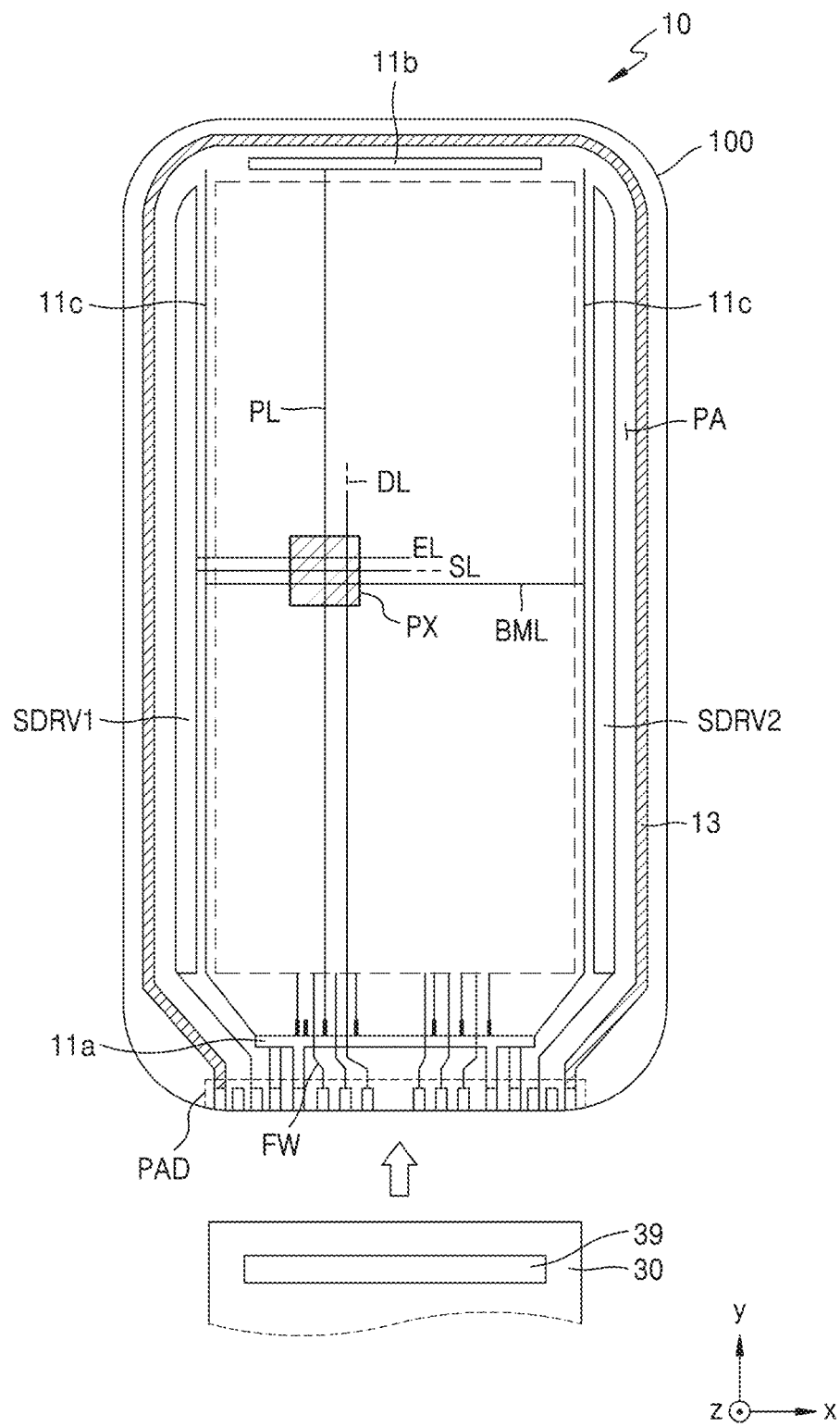
FIG. 9 is a plan view of an embodiment of a display panel.
Figure 10:
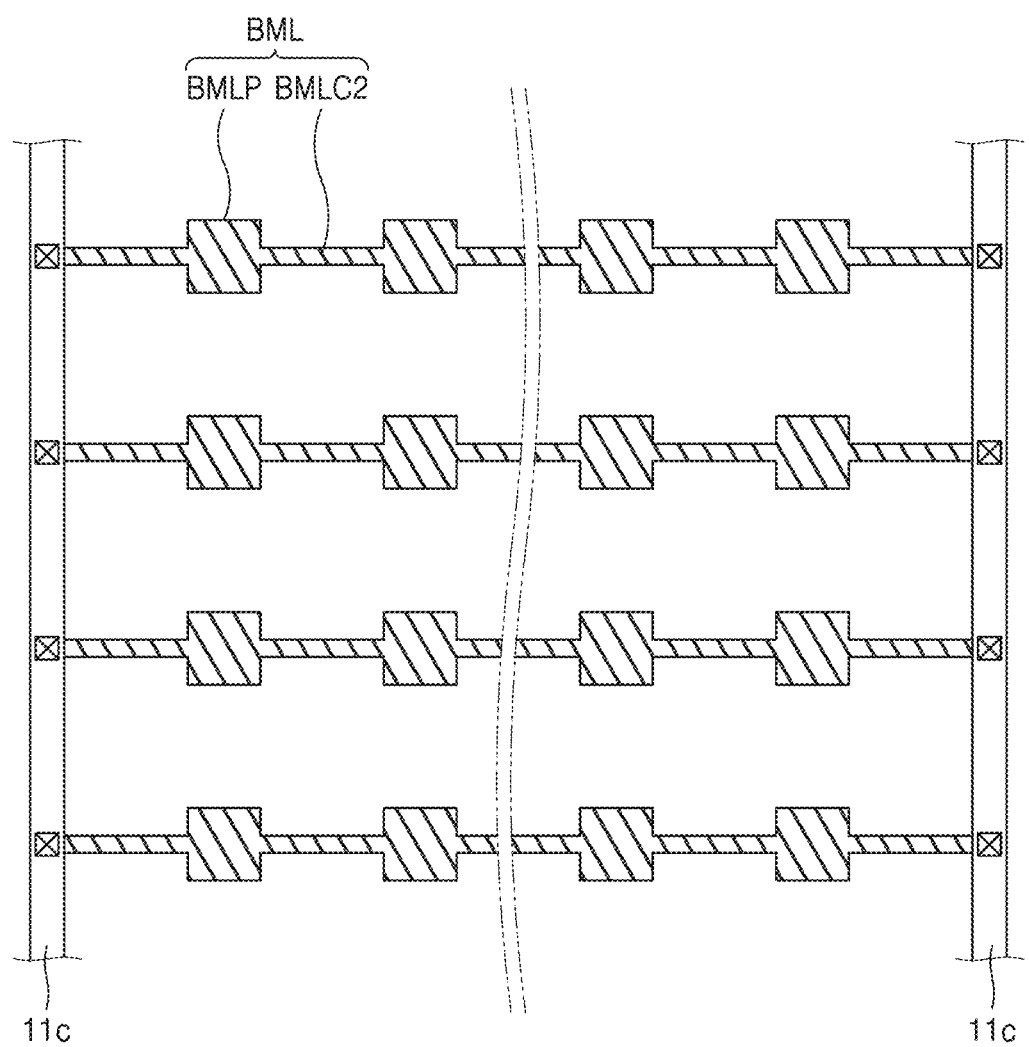
FIG. 10 is a view of an embodiment of a portion of FIG. 9.

FIG. 9 is a plan view of a display panel. FIG. 10 is a view of a portion of FIG. 9.

Compared to the embodiment of FIG. 3, the embodiment of FIG. 9 further includes a third driving voltage supply line 11c in the peripheral area PA. Hereinafter, detailed description of elements that are the same as those of the embodiment of FIG. 2 is omitted, and differences are mainly described.

The shield layer BML may be arranged in the display area DA. Referring to FIG. 10, the shield layer BML may include second connection lines BMLC2 and shield patterns BMLP. The shield pattern BMLP may correspond to a portion of each pixel circuit and be arranged below the pixel circuit. The second connection line BMLC2 may connect the shield patterns BMLP of the pixel circuits of the same row and be extended in the x-direction. The shield pattern BMLP and the second connection line BMLC2 may be a unitary single body.

The third driving voltage supply line 11c may be further arranged in the peripheral area PA, the third driving voltage supply line 11c extending in the y-direction from the first driving voltage supply line 11a. The third driving voltage supply line 11c may be arranged between the display area DA and the first scan driving circuit SDRV1 and between the display area DA and the second scan driving circuit SDRV2.

One end of the shield layer BML, that is, the left end of the second connection line BMLC2 may be connected to the third driving voltage supply line 11c on the left, and another end of the shield layer BML, that is, the right end may be connected to the third driving voltage supply line 11c on the right. Because the shield layer BML is connected to the third driving voltage supply line 11c, the shield layer BML may receive the driving voltage ELVDD through the third driving voltage supply line 11c.

The first driving voltage supply line 11a may be connected to the terminal portion PAD and supplied with the driving voltage ELVDD from the display driver 39. The first driving voltage supply line 11a and the second driving voltage supply line 11b may be connected to the driving voltage line PL.

Figure 11:
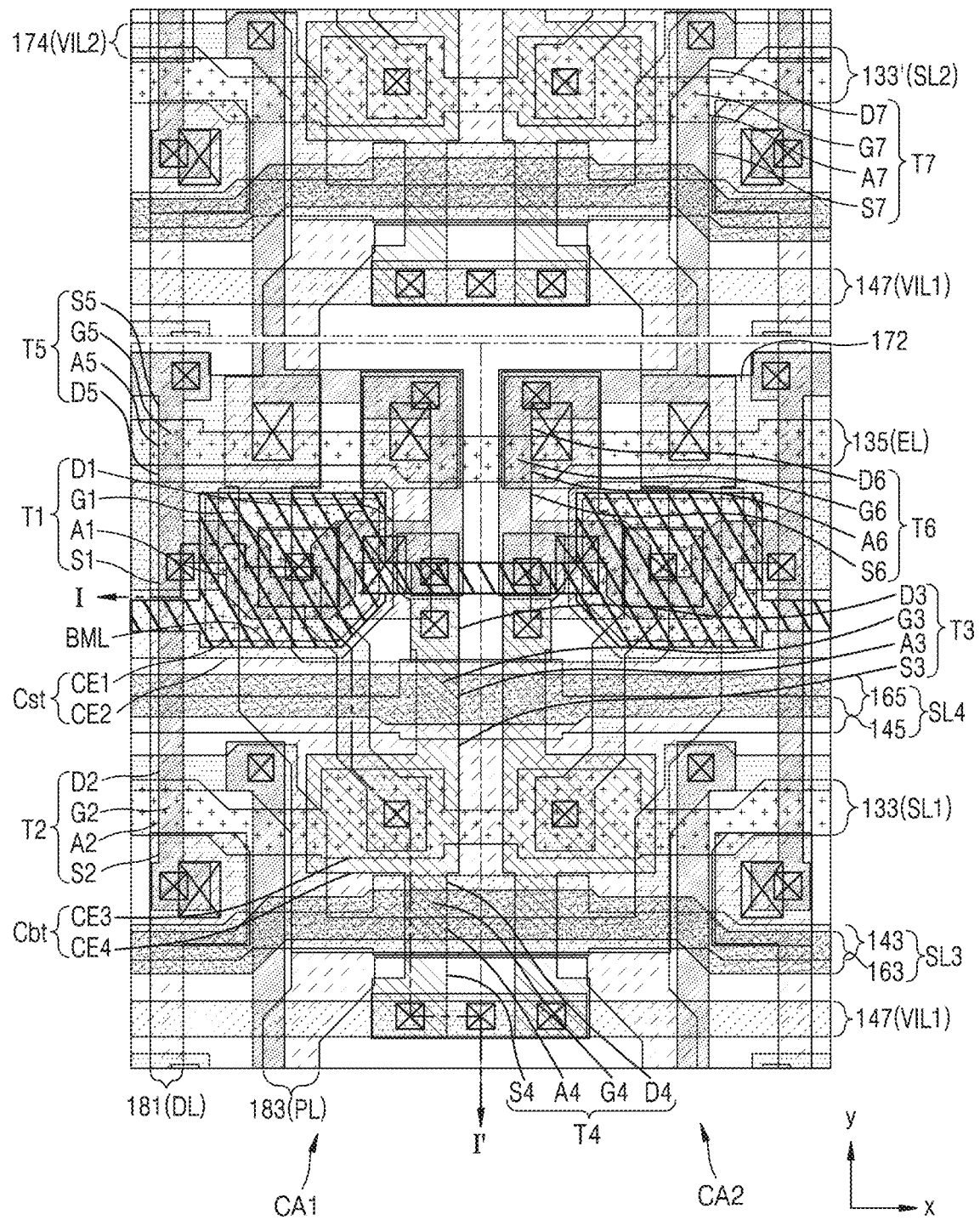
FIG. 11 is an arrangement view of an embodiment of the positions of a plurality of TFTs and capacitors arranged in a pair of pixel circuits of a display apparatus.
Figure 12:
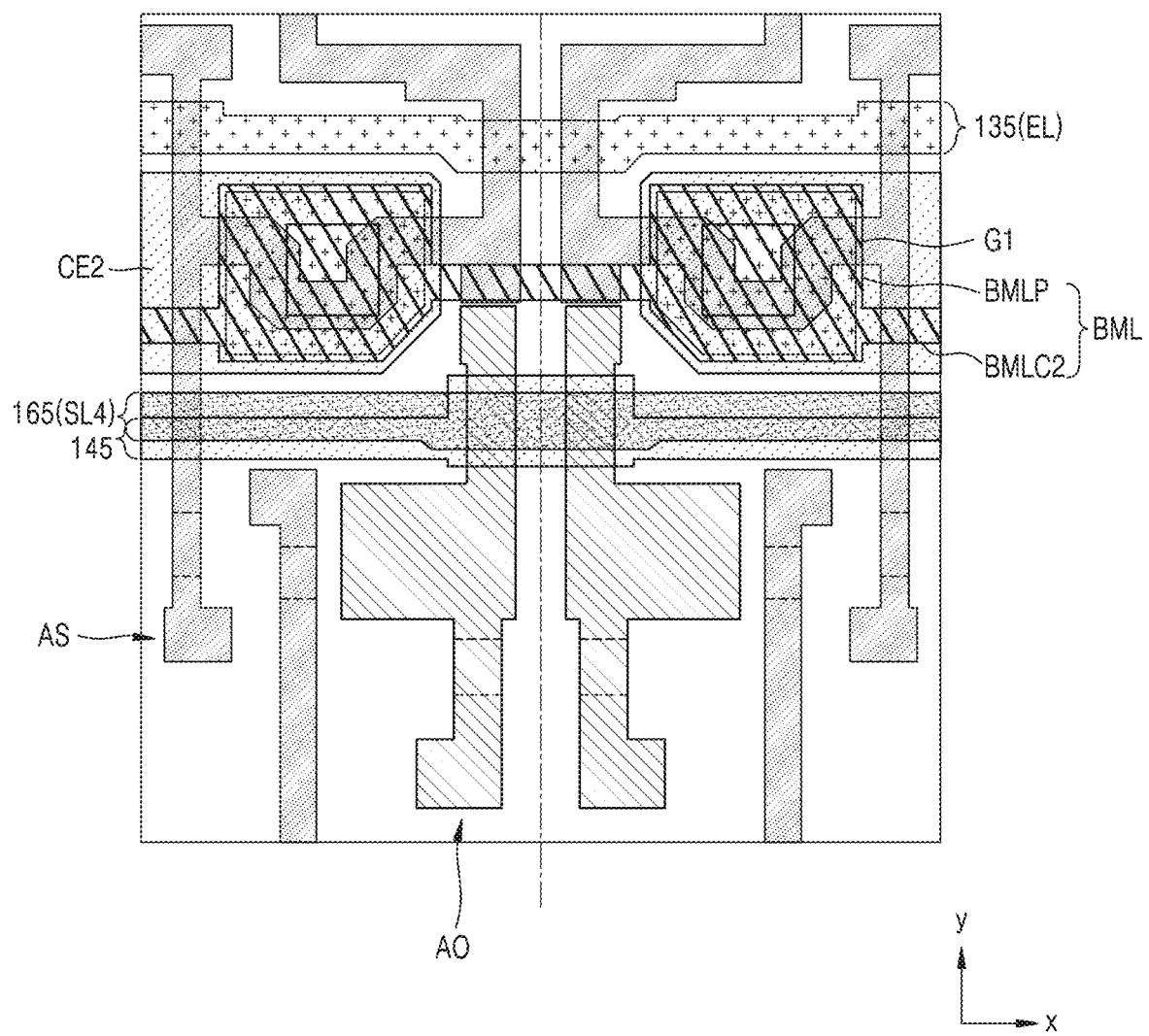
FIG. 12 is an arrangement view of an embodiment of only a portion of FIG. 11.

FIG. 11 is an arrangement view of an embodiment of the positions of a plurality of TFTs and capacitors arranged in a pair of pixel circuits of a display apparatus. FIG. 12 is an arrangement view of an embodiment of only a portion of FIG. 11. FIG. 11 shows a pixel circuit to which the shield layer BML of FIGS. 9 and 10 is applied. Hereinafter, detailed description of elements that are the same as those described with reference to FIGS. 5 to 8 is omitted, and differences are mainly described.

As shown in FIG. 6, the shield layer BML may be arranged between the first barrier layer 110a and the second barrier layer 110b in the display area DA. The shield layer BML may include the shield pattern BMLP and the second connection line BMLC2, the shield pattern BMLP being arranged to correspond to the first transistor T1, which is a silicon-based transistor of a pixel circuit, and the first connection line BMLC1 extending in the x-direction from the shield pattern BMLP. That is, the shield patterns BMLP may each overlap the first transistor T1 of the pixel circuit. The second connection line BMLC2 may be arranged in parallel to the emission control line 135.

In another embodiment, the shield layer BML may be arranged between the second barrier layer 110b and the buffer layer 111.

Figure 13:
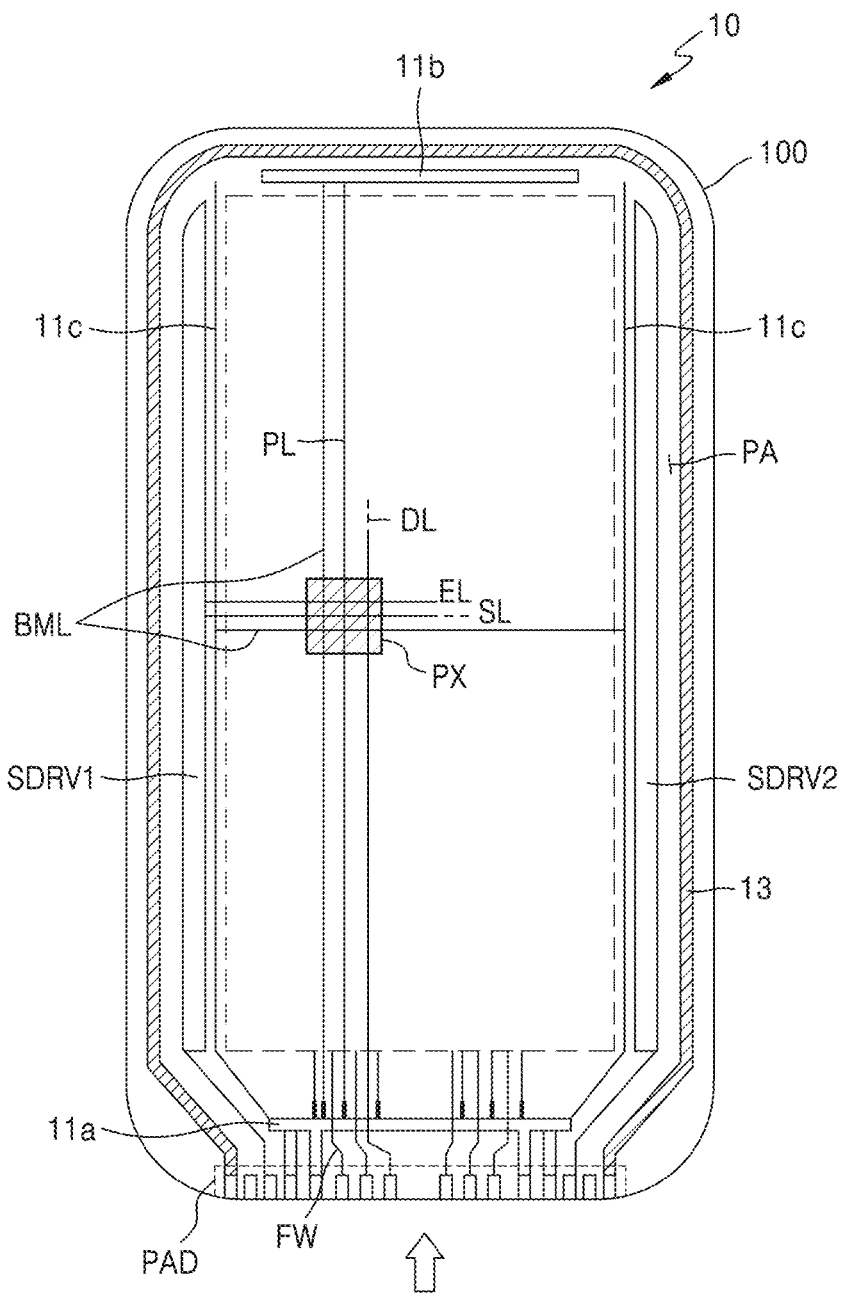
FIG. 13 is a plan view of an embodiment of a display panel.
Figure 14:
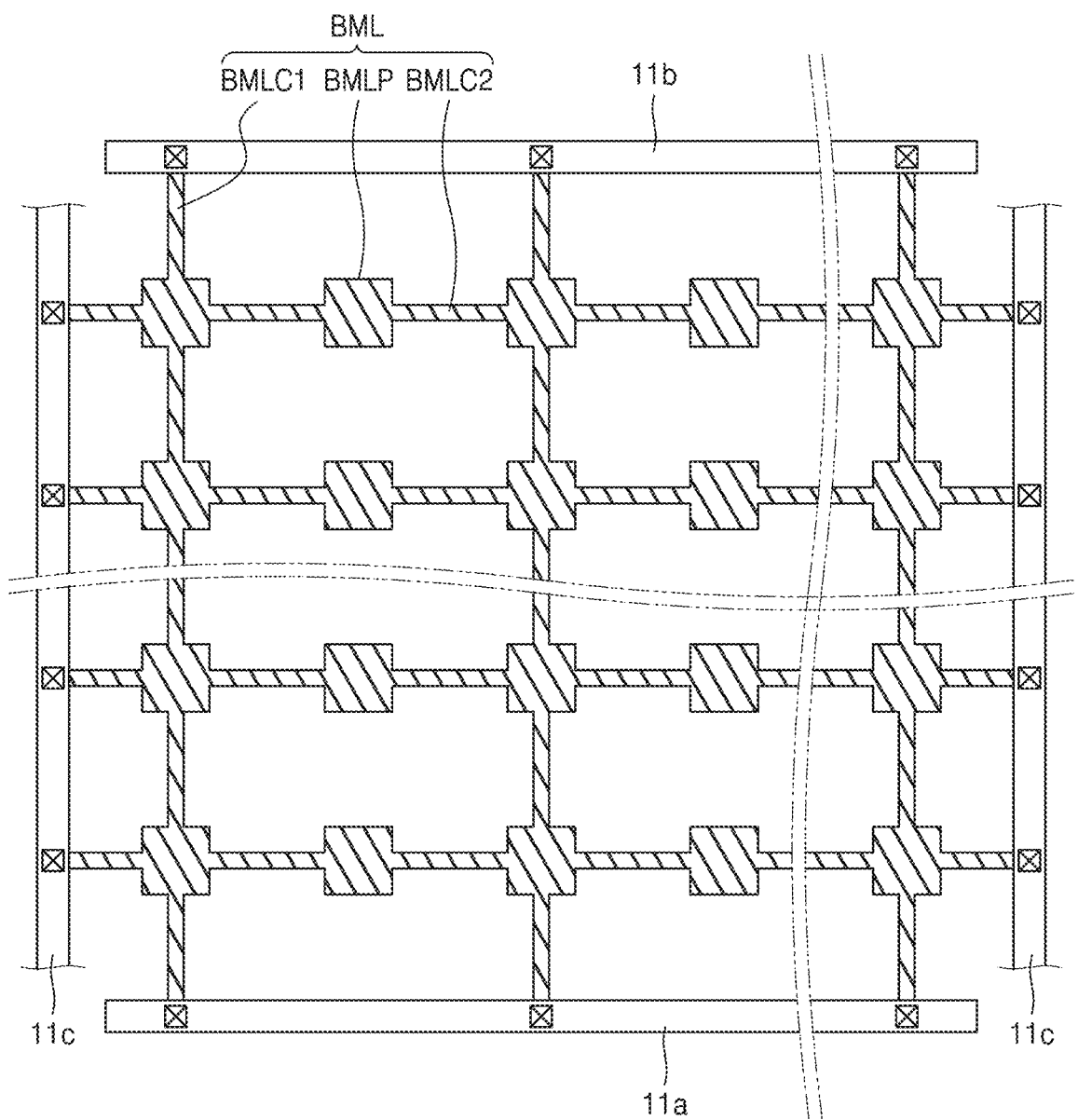
FIG. 14 is a view of an embodiment of a portion of FIG. 13.
Figure 15:
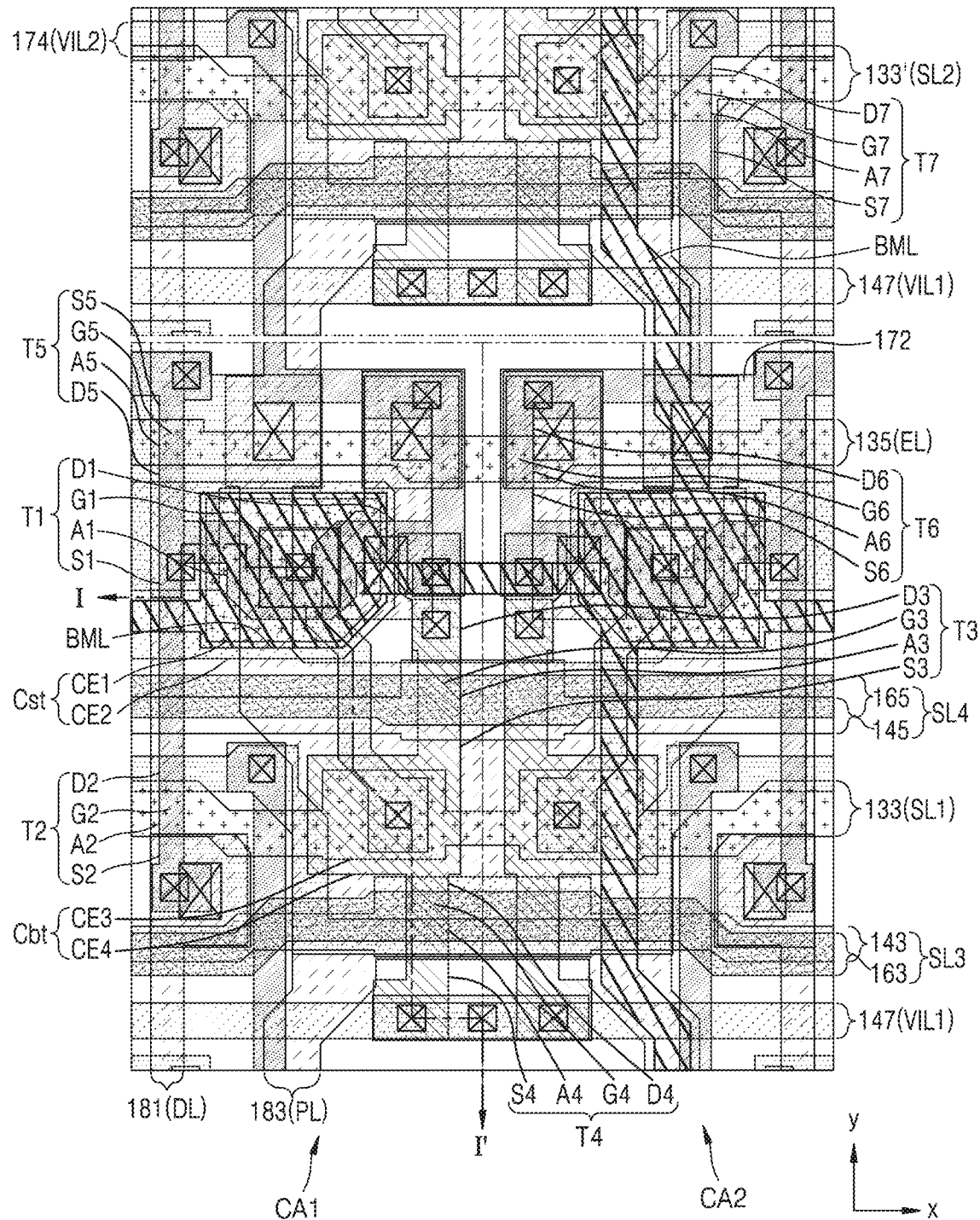
FIG. 15 is an arrangement view of an embodiment of the positions of a plurality of TFTs and capacitors arranged in a pair of pixel circuits of a display apparatus.
Figure 16:
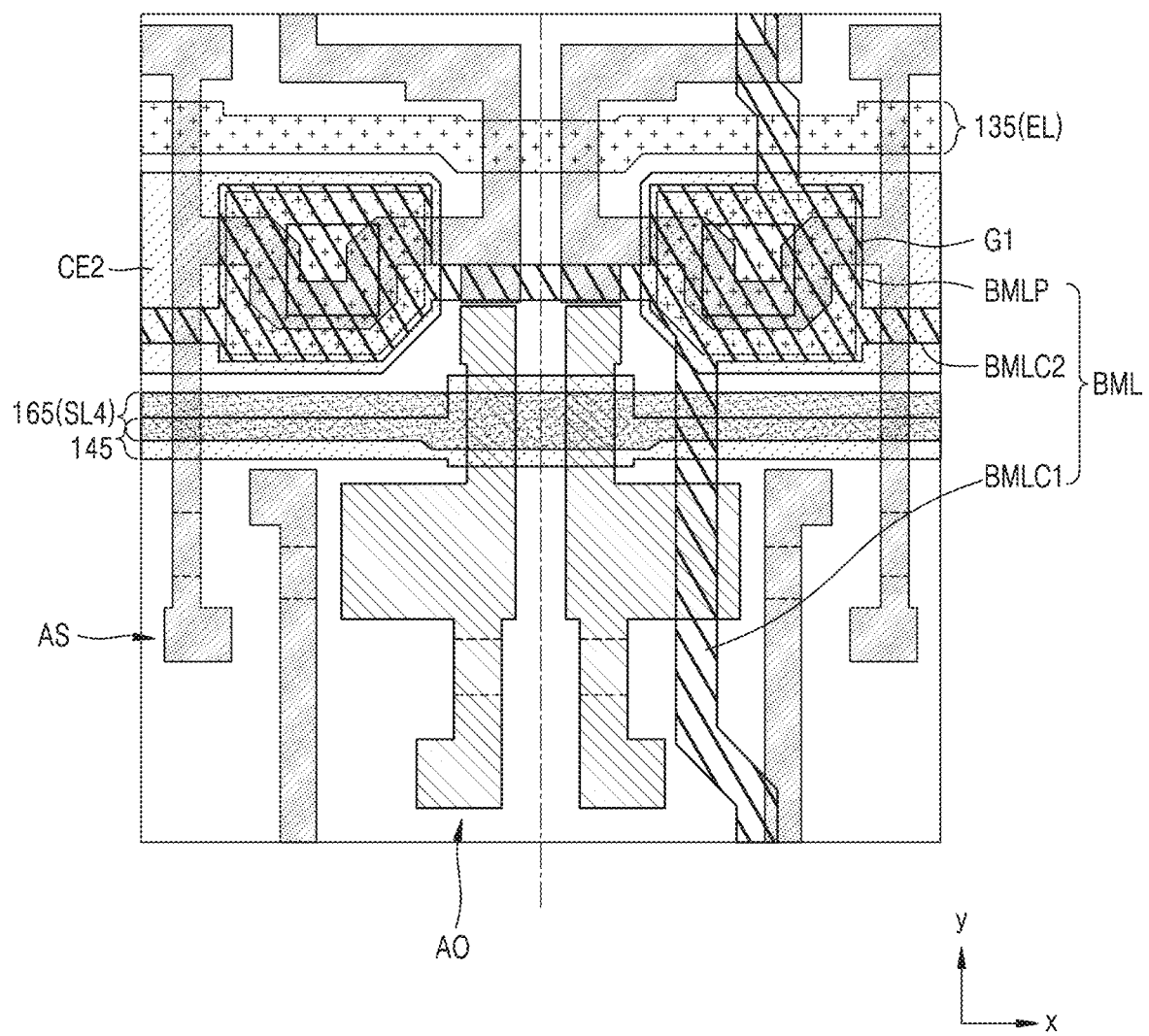
FIG. 16 is a view of an embodiment of a portion of FIG. 15.

FIG. 13 is a plan view of an embodiment of a display panel. FIG. 14 is a view of an embodiment of a portion of FIG. 13. FIG. 15 is an arrangement view of an embodiment of the positions of a plurality of TFTs and capacitors arranged in a pair of pixel circuits of a display apparatus. FIG. 16 is a view of an embodiment of a portion of FIG. 15. FIG. 15 shows a pixel circuit to which the shield layer BML of FIGS. 13 and 14 is applied. Hereinafter, description will be made focusing on differences from the above embodiments.

The shield layer BML may be arranged in the display area DA. As shown in FIG. 6, the shield layer BML may be arranged between the first barrier layer 110a and the second barrier layer 110b in the display area DA.

The shield layer BML may include the shield patterns BMLP, the first connection lines BMLC1, and the second connection lines BMLC2, the shield pattern BMLP being arranged to correspond to the first transistor T1, which is a silicon-based transistor of a pixel circuit, the first connection lines BMLC1 connecting the shield patterns BMLP of pixel circuits on the same column and extending in the y-direction, and the second connection lines BMLC2 connecting the shield patterns BMLP of pixel circuits on the same row and extending in the x-direction from the shield pattern BMLP. That is, the shield patterns BMLP may each overlap the first transistor T1 of the pixel circuit. The shield pattern BMLP, and the first and second connection lines BMLC1 and BMLC2 may be a unitary single body. In another embodiment, the shield layer BML may be arranged between the second barrier layer 110b and the buffer layer 111.

The first connection lines BMLC1 may be arranged every row. The second connection lines BMLC2 may be arranged every two column. The first connection line BMLC1 may be arranged in parallel to the data line 181, and the second connection line BMLC2 may be arranged in parallel to the emission control line 135.

The left/right ends of the shield layer BML, that is, the left end of the second connection line BMLC2 may be connected to the third driving voltage supply line 11c on the left, and the right end may be connected to the third driving voltage supply line 11c on the right. The top/bottom ends of the shield layer BML, that is, the top end of the first connection line BMLC1 may be connected to the second driving voltage supply line 11b on the top, and the bottom end may be connected to the first driving voltage supply line 11a on the bottom. Because the shield layer BML is connected to the first driving voltage supply line 11a and the third driving voltage supply line 11c, the shield layer BML may receive the driving voltage ELVDD through the first driving voltage supply line 11*a* and the third driving voltage supply line 11*c*.

The first driving voltage supply line 11*a* may be connected to the terminal portion PAD, and supplied with the driving voltage ELVDD from the display driver 39. The first driving voltage supply line 11*a* and the second driving voltage supply line 11*b* may each be connected to the driving voltage line PL.

Though it is shown in FIGS. 13 and 14 that the shield layer BML is connected to the first driving voltage supply line 11*a*, the second driving voltage supply line 11*b*, and the third driving voltage supply line 11*c*, the third driving voltage supply line 11*c* may be omitted and the left/right ends of the second connection line BMLC2 of the shield layer BML may be respectively connected to the first driving voltage supply line 11*a* and the second driving voltage supply line 11*b* in another embodiment.

Figure 17:
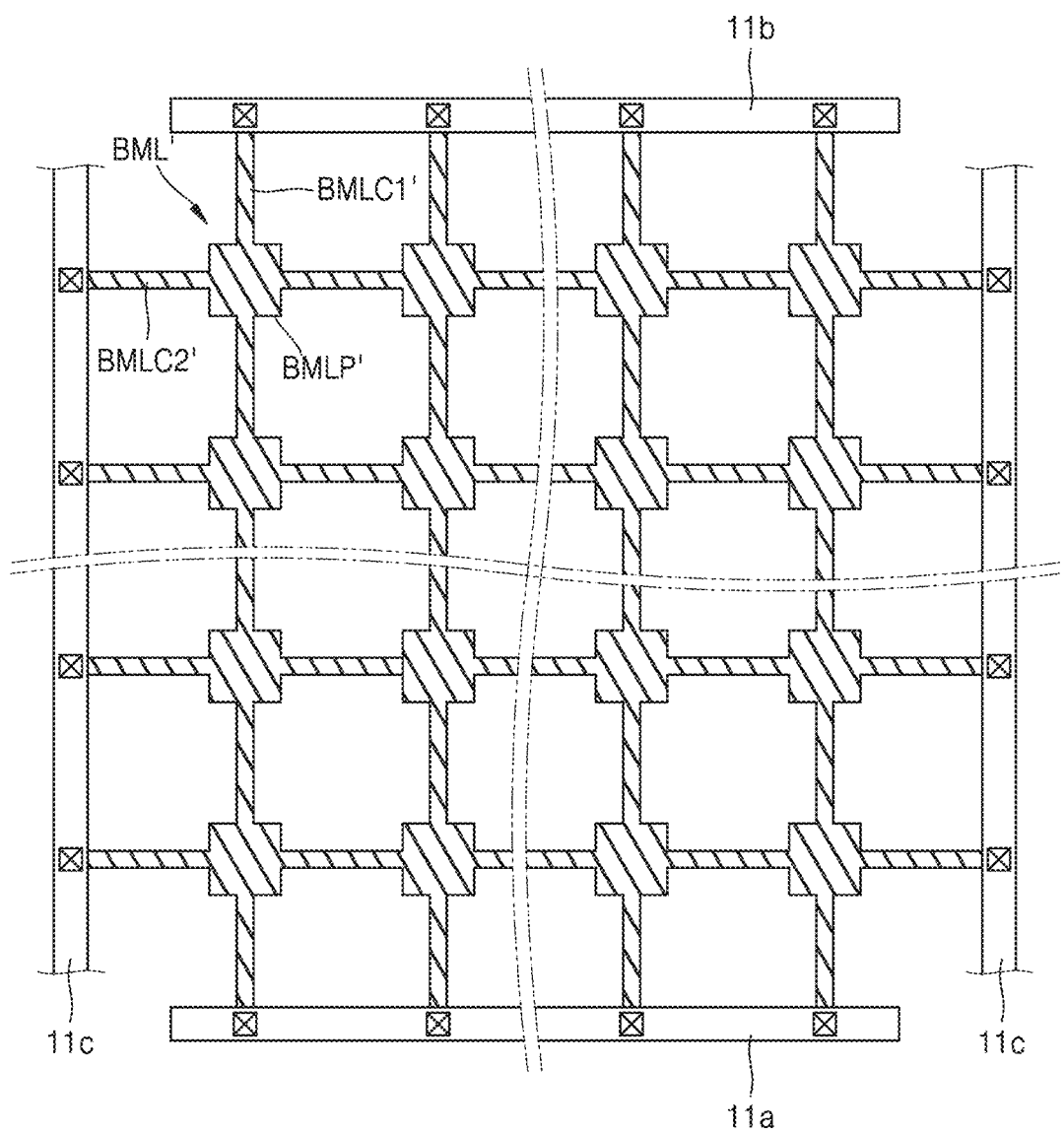
FIG. 17 is a view of a comparative example of a shield layer.

FIG. 17 is a view of a comparative example a shield layer BML'.

Referring to FIG. 17, the shield layer BML' according to a comparative example may include shield patterns BMLP', first connection lines BMLC1', and second connection lines BMLC2', the shield patterns BMLP' being arranged on a pixel basis, the first connection lines BMLC1' extending in the y-direction and connecting the shield patterns BMLP', and the second connection lines BMLC2' extending in the x-direction and connecting the shield patterns BMLP'. That is, in the shield layer BML' according to a comparative example, the shield patterns BMLP' may be mesh-connected by the first connection lines BMLC1' and the second connection lines BMLC2'.

The first connection lines BMLC1' may each be arranged in parallel to the data line for each column, and the second connection lines BMLC2' may each be arranged in parallel to the emission control line for each row. The first connection lines BMLC1' may partially overlap the emission control line, and the second connection lines BMLC2' may partially overlap the data line. Accordingly, a coupling capacitance may be generated between the first connection lines BMLC1' and the emission control line, and thus, a defective horizontal line may occur to an image. An electric signal interference such as coupling may occur between the second connection lines BMLC2' and the data line while a voltage corresponding to a data signal is changed in the data line.

In contrast, in an embodiment shown in FIG. 5, the driving voltage ELVDD is applied to the shield layer BML connecting the shield patterns BMLP through only the first connection lines BMLC1. Accordingly, an area that overlaps the data line is reduced compared to the shield layer BML' having a mesh structure according to a comparative example, and thus, coupling between the shield layer BML and the data line may be reduced.

In addition, in an embodiment shown in FIG. 11, the driving voltage ELVDD is applied to the shield layer BML connecting the shield patterns BMLP through only the second connection lines BMLC2. Accordingly, an area that overlaps the emission control line is reduced compared to the shield layer BML' having a mesh structure according to a comparative example, and thus, coupling between the shield layer BML and the emission control line may be reduced and a horizontal line defect may be reduced (prevented).

In addition, an embodiment shown in FIG. 15 connects the shield patterns BMLP through the first connection lines BMLC1 and the second connection lines BMLC2, and includes the first connection lines BMLC1 on two-column basis, thereby reducing the number of first connection lines BMLC1. Accordingly, compared to the shield layer BML' according to a comparative example, an area that overlaps the emission control line is reduced, and thus, a coupling capacitance between the shield layer BML and the emission control line may be reduced and a horizontal line defect may be reduced (prevented).

In an embodiment, because the pixel circuit that drives the display element includes a silicon-based transistor and an oxide-based transistor, the high-resolution display apparatus with low power consumption may be provided. In addition, because the shield layer is provided below the silicon-based transistor (particularly, the driving transistor), the element characteristics of the transistor may be more stabilized and the display apparatus with improved display quality may be provided.

By embodiments, because the pixel circuit that drives the display element includes a silicon-based transistor and an oxide-based transistor, and the shield layer is provided below the silicon-based transistor, the element characteristics of the transistor may be more stabilized and the display apparatus with improved display quality may be provided. However, the scope of the invention is not limited by this effect.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope of the invention.

What is claimed is:
1. A display panel comprising:
  a substrate including a display area and a peripheral area surrounding the display area;
  a first thin-film transistor arranged in the display area of the substrate and including:
    a first semiconductor layer including a silicon semiconductor; and
    a first gate electrode overlapping the first semiconductor layer;
  a second thin-film transistor connected to the first thin-film transistor and including:
    a second semiconductor layer including an oxide semiconductor; and
    a second gate electrode overlapping the second semiconductor layer;
  a voltage line connected to the first thin-film transistor; and
  a shield layer arranged between the substrate and the first semiconductor layer, and including:
    a plurality of patterns including a pattern overlapping the first semiconductor layer; and
    a connection line extending from the pattern in a row direction,
  wherein a voltage which is a same as a voltage applied to the voltage line is applied to the shield layer, and
  the second semiconductor layer does not overlap the plurality of patterns of the shield layer.

2. The display panel of claim 1, wherein the second thin-film transistor is connected between to the first semiconductor layer and the first gate electrode of the first thin-film transistor.

3. The display panel of claim 1, wherein the shield layer includes a metal material.

4. The display panel of claim 1, further comprising:
a first inorganic layer between the substrate and the shield layer; and
a second inorganic layer between the shield layer and the first semiconductor layer.

5. The display panel of claim 4, wherein the substrate includes an organic layer.

6. The display panel of claim 1, further comprising:
a first signal line and a second signal line each, in a plan view, adjacent to the first semiconductor layer with the first semiconductor layer therebetween, extending in the row direction, and not overlapping the shield layer; and
a third signal line adjacent to the first semiconductor layer, extending in a column direction, and overlapping the connection line.

7. The display panel of claim 1, further comprising a voltage supply line arranged in the peripheral area and connected to the shield layer.

* * * * *